United States Patent
Kim et al.

(10) Patent No.: US 9,590,103 B2
(45) Date of Patent: Mar. 7, 2017

(54) SEMICONDUCTOR DEVICES HAVING MULTIPLE GATE STRUCTURES AND METHODS OF MANUFACTURING SUCH DEVICES

(71) Applicants: Yoon Hae Kim, Suwon-si (KR); Jin Wook Lee, Seoul (KR); Jong Ki Jung, Hwaseong-si (KR); Myung Il Kang, Yongin-si (KR); Kwang Yong Yang, Seoul (KR); Kwan Heum Lee, Suwon-si (KR); Byeong Chan Lee, Yongin-si (KR)

(72) Inventors: Yoon Hae Kim, Suwon-si (KR); Jin Wook Lee, Seoul (KR); Jong Ki Jung, Hwaseong-si (KR); Myung Il Kang, Yongin-si (KR); Kwang Yong Yang, Seoul (KR); Kwan Heum Lee, Suwon-si (KR); Byeong Chan Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/990,863

(22) Filed: Jan. 8, 2016

(65) Prior Publication Data

US 2016/0343858 A1    Nov. 24, 2016

(30) Foreign Application Priority Data

May 21, 2015    (KR) .................. 10-2015-0071011

(51) Int. Cl.
*H01L 29/78*    (2006.01)
*H01L 29/165*    (2006.01)
*H01L 27/088*    (2006.01)
*H01L 29/08*    (2006.01)

(52) U.S. Cl.
CPC ...... *H01L 29/7848* (2013.01); *H01L 27/0886* (2013.01); *H01L 29/0847* (2013.01); *H01L 29/165* (2013.01)

(58) Field of Classification Search
CPC ............. H01L 29/7831; H01L 29/7855; H01L 2027/11866; H01L 29/7848; H01L 27/0886; H01L 29/165; H01L 29/0847
See application file for complete search history.

(56) References Cited

U.S. PATENT DOCUMENTS

| | | |
|---|---|---|
| 5,291,052 A | 3/1994 | Kim et al. |
| 6,344,388 B1 | 2/2002 | Oishi et al. |
| 6,346,468 B1 | 2/2002 | Pradeep et al. |

(Continued)

FOREIGN PATENT DOCUMENTS

| | | |
|---|---|---|
| KR | 1019990012234 A | 2/1999 |
| KR | 10-0395878 | 8/2003 |

*Primary Examiner* — Roy Potter
*Assistant Examiner* — Paul Patton
(74) *Attorney, Agent, or Firm* — Myers Bigel, P.A.

(57) ABSTRACT

A semiconductor device includes a substrate having a first region and a second region, a plurality of first gate structures in the first region, the first gate structures being spaced apart from each other by a first distance, a plurality of second gate structures in the second region, the second gate structures being spaced apart from each other by a second distance, a first spacer on sidewalls of the first gate structures, a dielectric layer on the first spacer, a second spacer on sidewalls of the second gate structures, and a third spacer on the second spacer.

20 Claims, 17 Drawing Sheets

(56) References Cited

U.S. PATENT DOCUMENTS

| | | |
|---|---|---|
| 7,436,029 B2 | 10/2008 | Doris et al. |
| 7,713,810 B2 | 5/2010 | Hagemeyer et al. |
| 7,999,325 B2 | 8/2011 | Teh et al. |
| 8,334,570 B2 | 12/2012 | Xu et al. |
| 8,536,654 B2 | 9/2013 | Chambers et al. |
| 2003/0045061 A1 | 3/2003 | Kwon et al. |
| 2014/0369115 A1 | 12/2014 | Kim et al. |
| 2015/0014788 A1* | 1/2015 | Park .................. H01L 29/66545 257/401 |

* cited by examiner

SEMICONDUCTOR DEVICES HAVING MULTIPLE GATE STRUCTURES AND METHODS OF MANUFACTURING SUCH DEVICES

CROSS-REFERENCE TO RELATED APPLICATION

This U.S. non-provisional patent application claims priority under 35 U.S.C. §119 to Korean Patent Application No. 10-2015-0071011, filed on May 21, 2015 in the Korean Intellectual Property Office, the content of which is incorporated by reference herein in its entirety.

BACKGROUND

Semiconductor devices are becoming more highly integrated in response to demand for smaller, lower power electronic devices. Fin field effect transistors (FinFET) that have a three-dimensional channel structure have been developed that may reduce short channel effects that can arise with increasingly high levels of device integration. In addition, research into techniques for increasing charge carrier mobility are currently in progress.

SUMMARY

Example embodiments of the inventive concepts provide semiconductor devices that include a plurality of gate structures and methods of manufacturing the same.

In an example embodiment of the inventive concepts, a semiconductor device includes a substrate having a first region and a second region, a plurality of first gate structures in the first region, the first gate structures being spaced apart from each other by a first distance, a plurality of second gate structures in the second region, the second gate structures being spaced apart from each other by a second distance, a plurality of first spacers on sidewalls of the respective first gate structures, a dielectric layer on outer sidewalls of the respective first spacers, a plurality of second spacers on sidewalls of the respective second gate structures, and a plurality of third spacers on outer sidewalls of the respective second spacers. A sum of a first thickness of a first of the first spacers and a second thickness of the dielectric layer that are on a sidewall of a first of the first gate structures may be substantially equal to a sum of a third thickness of a first of the second spacers and a fourth thickness of a first of the third spacers that are on a sidewall of a first of the second gate structures.

In some example embodiments, the first thickness of the first of the first spacers may be substantially equal to the third thickness of the first of the second spacers and the second thickness of the dielectric layer may be substantially equal to the fourth thickness of the first of the third spacers.

In some example embodiments, the first distance may be substantially equal to the second distance, and a first gap that is between portions of the dielectric layer that are on facing sidewalls of an adjacent pair of the first gate structures may be substantially equal to a second gap between the third spacers that are on facing sidewalls of an adjacent pair of the second gate structures.

In some example embodiments, the semiconductor device may further include an etch stop layer on sidewalls of the dielectric layer and the third spacer. A third gap between portions of the etch stop layer that are on facing sidewalls of the adjacent pair of the first gate structures may be substantially equal to a fourth gap between portions of the etch stop layer that are on facing sidewalls of the adjacent pair of the second gate structures.

In some example embodiments, the semiconductor device may further include at least a first active fin that extends in a first direction in the first region to cross under the first gate structures. The first spacers may have an L-shaped cross-section.

In some example embodiments, the first of the first spacers may have a parallel portion and a perpendicular portion with respect to an upper surface of the substrate. A length of the parallel portion in the first direction may be substantially equal to the sum of the first thickness and the second thickness.

In some example embodiments, a length of the parallel portion of the first of the first spacers may be greater than the sum of the first thickness and the second thickness.

In some example embodiments, the semiconductor device may further include a plurality of first embedded source/drain regions on opposed sides of the first gate structures. The dielectric layer may cover an upper surface of the first embedded source/drain regions.

In some example embodiments, the first embedded source/drain regions may include an N-type impurity.

In some example embodiments, an upper portion of the first embedded source/drain regions may comprise undoped silicon.

In some example embodiments, the semiconductor device may further include at least a second active fin that extends in the first direction in the second region to cross under the second gate structures. The second spacers may have L-shapes cross-sections.

In some example embodiments, the first of the second spacers may have a parallel portion and a perpendicular portion with respect to an upper surface of the substrate. A length of the parallel portion in the first direction may be greater than the sum of the third thickness and the fourth thickness.

In some example embodiments, the third spacers may have L-shaped cross-sections.

In some example embodiments, the first spacers may include substantially the same material as the second spacers.

In some example embodiments, the dielectric layer may include substantially the same material as the third spacers.

In some example embodiments, the semiconductor device may further include a plurality of second embedded source/drain regions on opposed sides of the second gate structures. The second embedded source/drain regions may comprise silicon germanium (SiGe) doped with a P-type impurity.

In some example embodiments, the second embedded source/drain regions may include a plurality of regions having different germanium (Ge) concentration from each other.

In another example embodiment of the inventive concepts, a semiconductor device includes a substrate having a first region and a second region, a plurality of first gate structures in the first region, the first gate structures being spaced apart from each other by a first distance, a plurality of first spacers on sidewalls of the respective first gate structures, a plurality of first embedded source/drain regions on opposed sides of the first gate structures, a dielectric layer on outer sidewalls of the first spacers and on upper surfaces of the first embedded source/drain regions, a plurality of second gate structures in the second region, the second gate structures being spaced apart from each other by a second distance, a plurality of second spacers on sidewalls of the respective second gate structures, a plurality of third spacers on outer sidewalls of the second spacers, and a plurality of second embedded source/drain regions on opposed sides of the second gate structures. A first thickness of one of the first spacers may be substantially equal to a thickness of one of the second spacers, and a second thickness of the dielectric layer may be substantially equal to a thickness of one of the third spacers.

In some example embodiments, the first distance may be substantially equal to the second distance, and a first gap that is between portions of the dielectric layer that are on facing sidewalls of an adjacent pair of the first gate structures may be substantially equal to a second gap between the third spacers that are on facing sidewalls of an adjacent pair of the second gate structures.

In some example embodiments, the first through third spacers may each have an L-shaped cross-section.

In yet another example embodiment of the inventive concepts, a semiconductor device includes a substrate having a first region and a second region, the first region including a plurality of first active fins and the second region including a plurality of second active fins, a plurality of first gate structures that cross over the first active fins in the first region, the first gate structures being spaced apart from each other by a first distance, a plurality of first embedded source/drain regions on opposed sides of the first gate structures, a plurality of first spacers that have L-shaped cross-sections on sidewalls of the respective first gate structures, a dielectric layer on outer sidewalls of the first spacers and on upper surfaces of the first embedded source/drain regions, a plurality of second gate structures that cross over the second active fins in the second region, the second gate structures being spaced apart from each other by a second distance, a plurality of second embedded source/drain regions on opposed sides of the second gate structures, a plurality of second spacers that have L-shaped cross-sections on sidewalls of the respective second gate structures, and a plurality of third spacers that have L-shaped cross-sections on outer sidewalls of the second spacers.

In some example embodiments, a sum of a first thickness of a first of the first spacers that is on a first of the first gate structures and a second thickness of the dielectric layer that is on a sidewall of the first of the first gate structures may be substantially equal to a sum of a third thickness of a first of the second spacers that is on a first of the second gate structures and a fourth thickness of a first of the third spacers that is on a sidewall of the first of the second spacers.

In some example embodiments, the first distance may be substantially equal to the second distance. A first gap that is between portions of the dielectric layer that are on facing sidewalls of an adjacent pair of the first gate structures may be substantially equal to a second gap between the third spacers that are on facing sidewalls of an adjacent pair of the second gate structures.

In still another example embodiment of the inventive concepts, a method of manufacturing a semiconductor device includes forming a plurality of first active fins and a plurality of first sacrificial gate structures in a first region of a substrate, forming a plurality of second active fins and a plurality of second sacrificial gate structures in a second region of the substrate, forming a first preliminary spacer on sidewalls of the respective first sacrificial gate structures, the first preliminary spacer including a first spacer and a first sacrificial spacer, etching upper portions of the first active fins using the first preliminary spacers as an etch mask to form first recess regions at opposed sides of the first sacrificial gate structures, removing the first sacrificial spacer, epitaxially growing first embedded source/drain regions in the first recess regions, forming second preliminary spacers on sidewalls of the respective second sacrificial gate structures, the second preliminary spacers including a second spacer, a third spacer, and a second sacrificial spacer, etching upper portions of the second active fins using the second preliminary spacers as an etch mask to form second recess regions at opposed sides of the second sacrificial gate structures, removing the second sacrificial spacers, and epitaxially growing second embedded source/drain regions in the second recess regions.

In some example embodiments, the forming the first preliminary spacer may include forming a first insulating layer on the first sacrificial gate structures and on the second sacrificial gate structures, forming a second insulating layer on the first insulating layer, the second insulating layer having an etch selectivity with respect to the first insulating layer, performing an etch-back process on the second insulating layer to form the first sacrificial spacers, and performing an etch-back process on the first insulating layer to form the first spacers.

In some example embodiments, the first spacers may have L-shaped cross-sections.

In some example embodiments, removing the first sacrificial spacers may be performed by a wet etch process using at least one solution selected from a diluted HF solution and a buffered oxide etchant (BOE) solution.

In some example embodiments, removing the first sacrificial spacers may be performed by a dry etch process using at least one gas selected from $NH_3$ and $NF_3$.

In some example embodiments, the second insulating layer is removed in the second region during the removal of the first sacrificial spacers, and the first insulating layer of the second region may be not removed during the removal of the first sacrificial spacers.

In some example embodiments, forming the second preliminary spacers may include forming a third insulating layer on the substrate, forming a fourth insulating layer on the third insulating layer, the fourth insulating layer having an etch selectivity with respect to the third insulating layer, performing an etch-back process on the fourth insulating layer in the second region to form the second sacrificial spacers, and performing an etch-back process on the third and first insulating layers in the second region to form the third and second spacers, respectively.

In some example embodiments, the second and third spacers may have L-shaped cross-sections.

In some example embodiments, removing the second sacrificial spacers may be performed by a wet etch process using at least one solution selected from a diluted HF solution and a buffered oxide etchant (BOE) solution.

In some example embodiments, removing the second sacrificial spacers may be performed by a dry etch process using at least one gas selected from $NH_3$ and $NF_3$.

In some example embodiments, the fourth insulating layer in the first region may be removed during the removal of the second sacrificial spacers, and the third insulating layer in the first region may be not removed during the removal the second sacrificial spacers.

In some example embodiments, the method may further include forming an etch stop layer on the substrate after forming the second embedded source/drain regions, forming an interlayer dielectric layer on the etch stop layer, planarizing the interlayer dielectric layer to expose upper surfaces of the first and second sacrificial gate structures, removing the first sacrificial gate structures and the second sacrificial gate structures to form a third recess region and a fourth recess region, respectively, and forming a first gate structure and a second gate structure in the third recess region and the fourth recess region, respectively.

In still another example embodiment of the inventive concepts, a semiconductor device includes a substrate having an upper surface that extends in a first direction and in a second direction that is perpendicular to the first direction; a first active fin extending in the first direction in a first region of the substrate; a first gate structure that crosses over the first active fin in the first region of the substrate; a first embedded source/drain region on a first side of the first gate structure; a pair of first spacers having respective inner sidewalls that are directly on respective opposed sidewalls of the first gate structure, each of the first spacers including a first portion that extends in the first direction and a second portion that extends in a third direction that is perpendicular to both the first direction and the second direction; a dielectric layer that comprises a material different from a material of the first spacers directly on outer sidewalls of the respective first spacers; a second active fin extending in the first direction in a second region of the substrate; a second gate structure that crosses over the second active fin in the second region of the substrate; a second embedded source/drain region on a first side of the second gate structure; a pair of second spacers having respective inner sidewalls that are directly on respective opposed sidewalls of the second gate structure, each of the second spacers including a first portion that extends in the first direction and a second portion that extends in the third direction; and a pair of third spacers that comprises a material different from a material of the second spacers directly on outer sidewalls of the respective second spacers. The dielectric layer extends across an upper surface of the first embedded source/drain region while the third spacer does not extend across an upper surface of the second embedded source/drain region.

In some example embodiments, each of the first spacers has a first thickness, the dielectric layer has a second thickness, each of the second spacers has a third thickness and each of the third spacers has a fourth thickness, and a sum of the first thickness and the second thickness may be substantially equal to a sum of the third thickness and the fourth thickness.

In some example embodiments, the first thickness may be substantially equal to the third thickness and the second thickness may be substantially equal to the fourth thickness.

In some example embodiments, the semiconductor device may further include an etch stop layer. The etch stop layer may directly contact an upper surface of the second embedded source/drain region and may directly contact a portion of the dielectric layer that is on an upper surface of the first embedded source/drain region.

In some example embodiments, the first embedded source/drain region may have an upper surface that is above the upper surface of the substrate, and the second embedded source/drain region may be coplanar with the upper surface of the substrate.

In some example embodiments, the third spacers may each have a first portion that extends in the first direction and a second portion that extends in the third direction.

BRIEF DESCRIPTION OF THE DRAWINGS

The above aspects and features of the inventive concepts will become more apparent by describing in detail example embodiments thereof with reference to the attached drawings, in which.

DETAILED DESCRIPTION

Figure 1:
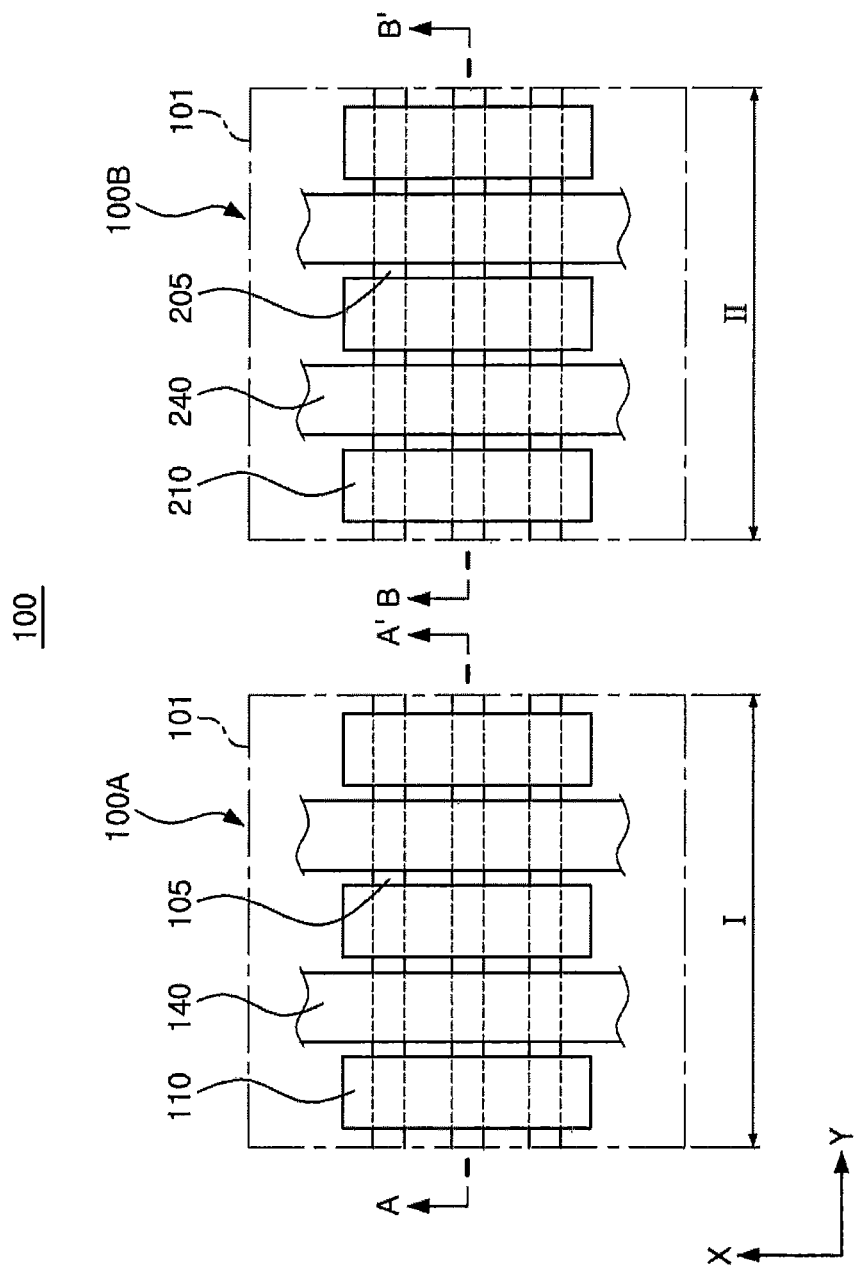
FIG. 1 is a plan view that illustrates first and second regions of a semiconductor device according to an example embodiment of the inventive concepts.

Example embodiments of the inventive concepts will now be described more fully hereinafter with reference to the accompanying drawings. It will be appreciated, however, that the inventive concepts may be embodied in many different forms and should not be construed as limited to the example embodiments set forth herein.

It will be understood that when an element is referred to as being "on," "connected to" or "coupled to" to another element, it can be directly on, connected to or coupled to the other element or intervening elements may be present. In contrast, when an element is referred to as "contacting," or being "directly on," "directly connected to" or "directly coupled" to" another element, there are no intervening elements present. Other words used to describe the relationship between elements or layers should be interpreted in a like fashion (e.g., "between" versus "directly between," "adjacent" versus "directly adjacent," "under" versus "directly under," etc.).

It will be understood that, although the terms "first," "second," etc., may be used herein to describe various elements, components, regions and/or layers, these elements, components, regions and/or layers are not limited by these terms. Unless the context indicates otherwise, these terms are only used to distinguish one element, component, region or layer from another element, component, region or layer. Thus, a first element, component, region or layer discussed below could be termed a second element, component, region or layer without departing from the teachings of example embodiments.

In the figures, the dimensions of layers and regions may be exaggerated for clarity. Like reference numerals refer to like elements throughout the drawings and specification.

Spatially relative terms, e.g., "beneath," "below," "lower," "above," "upper" and the like, may be used herein to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprising," "including" and derivatives thereof, when used in this specification, specify the presence of stated features, steps, operations, elements, and/or components, but do not preclude the presence or addition of one or more other features, steps, operations, elements, components, and/or groups thereof.

As used herein, the term "and/or" includes any and all combinations of one or more of the associated listed items. Unless defined otherwise, all technical and scientific terms used herein have the same meaning as commonly understood by one of ordinary skill in the art.

Example embodiments are described herein with reference to cross-sectional and plan views. The profile of an example view may be modified according to, for example, manufacturing techniques and/or tolerances. Accordingly, the example embodiments should not be construed as limited to the particular shapes of regions illustrated herein but are to include deviations in shapes that result, for example, from manufacturing. For example, a region illustrated as a rectangle may have rounded or curved features at its edges due to the manufacturing technique and/or tolerances. Thus, regions shown in the drawings are illustrated in schematic form and the exact shapes of the regions illustrate examples shapes but are not intended to be limiting.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, example embodiments of the inventive concepts will be described in detail with reference to the accompanying drawings.

Figure 2:
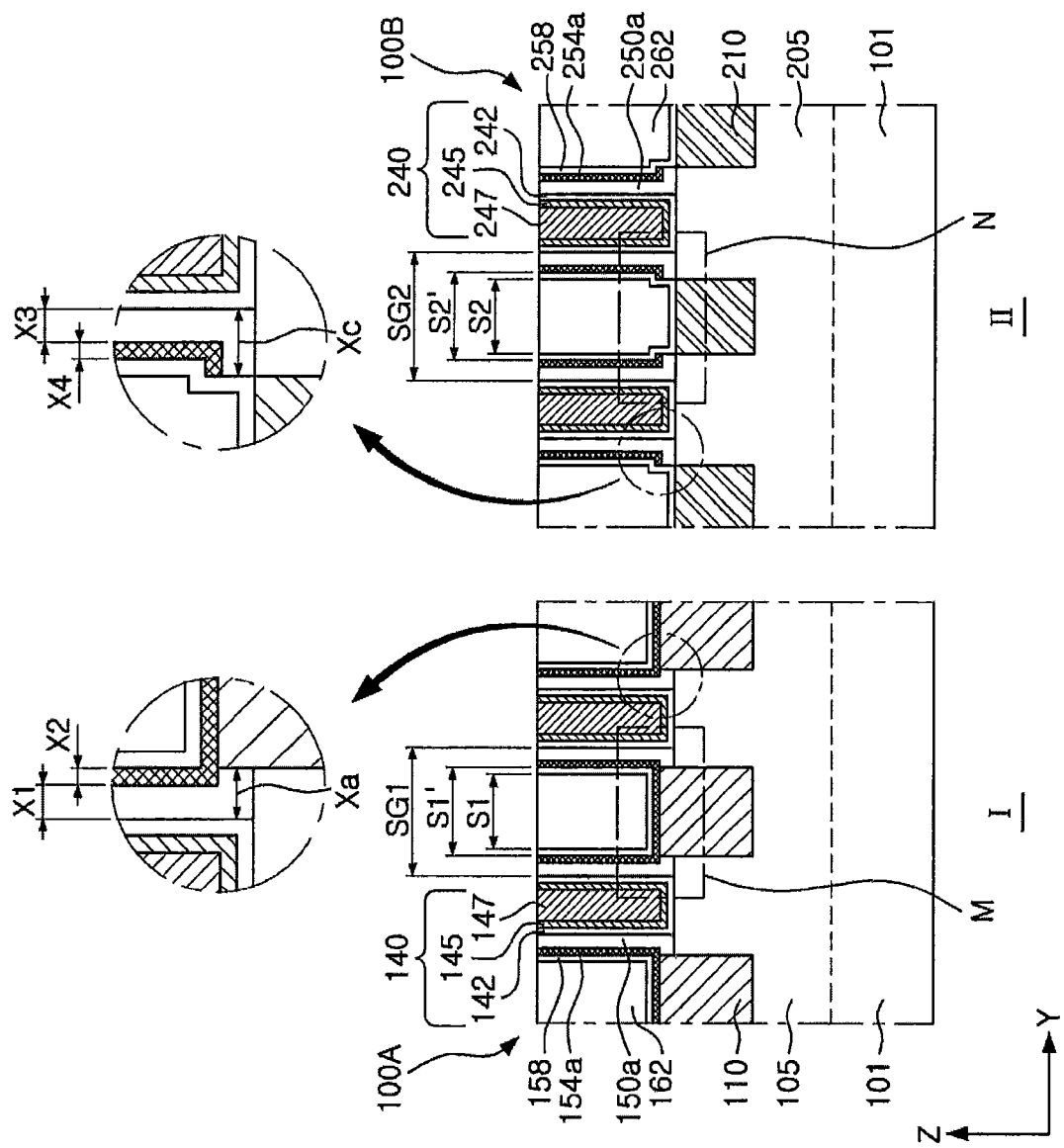
FIG. 2 is a cross-sectional view taken along lines A-A' and B-B' of FIG. 1.

FIG. 1 is a plan view that illustrates a first region I and a second region II of a semiconductor device 100 according to an example embodiment of the inventive concepts. FIG. 2 is a pair of cross-sectional views taken along lines A-A' and B-B', respectively, of FIG. 1. To simplify the drawings, some elements, such as first, second, and third spacers 150a, 250a and 254a and a first interlayer insulating layer 162 that are shown in FIG. 2 are omitted in FIG. 1.

Referring to FIGS. 1 and 2, the semiconductor device 100 may include a substrate 101 having the first region I and the second region II, a plurality of first transistors 100A that are formed in the first region I, and a plurality of second transistors 100B that are formed in the second region II.

The first region I may include a plurality of first active fins 105, a plurality of first gate structures 140, a plurality of first spacers 150a, a dielectric layer 154a, and a plurality of first embedded source/drain regions 110. The second region II may include a plurality of second active fins 205, a plurality of second gate structures 240, a plurality of second spacers 250a, a plurality of third spacers 254a, and a plurality of second embedded source/drain regions 210. The semiconductor device 100 may further include a first etch stop layer 158, a second etch stop layer 258, a first interlayer insulating layer 162, and a second interlayer insulating layer 262.

A plurality of N-type fin field effect transistors (FinFETs) may be formed in the first region I. A plurality of P-type fin field effect transistors (FinFETs) may be formed in the second region II. In some example embodiments, the first transistors 100A may be N-type FinFETs and the second transistors 100B may be P-type FinFETs.

The substrate 101 may have an upper surface that extends in the X-direction and in the Y-direction. The substrate 101 may include a semiconductor material, such as a group IV semiconductor, a group IV compound semiconductor, a group III-V compound semiconductor, or a group II-VI compound semiconductor. In some example embodiments, the substrate 101 may be a silicon substrate, a germanium substrate, or a silicon-germanium substrate. In some example embodiments, the substrate 101 may be a SOI (silicon-on-insulator) substrate or a GeOI (germanium-on-insulator) substrate.

The first and second active fins 105 and 205 may be formed on the substrate 101 and may extend in a first direction, e.g., the Y-direction. The first and second active fins 105 and 205 may protrude upwardly from the substrate 101. In some example embodiments, the first and second active fins 105 and 205 may be formed by etching or recessing the substrate 101 using, for example, a dry etching process. In other example embodiments, the first and second active fins 105 and 205 may comprise epitaxial layer(s) that are grown from the substrate 101. For example, the first active fins 105 may comprise a silicon layer that includes a P-type impurity and the second active fins 205 may comprise a silicon layer that includes an N-type impurity. The first and second active fins 105 and 205 may extend in the same direction. However, the example embodiments are not limited thereto.

A device isolation region may be disposed between each of the first active fins 105 and between each of the second active fins 205, respectively. The device isolation regions may be formed by a shallow trench isolation (STI) process. The device isolation regions may be formed of an insulating material, e.g., silicon oxide, silicon nitride, a low-k dielectric material, or a mixture thereof. The low-k dielectric material may include BPSG (boro-phospho-silicate glass), TOSZ (tonen silazene), USG (undoped silicate glass), SOG (spin on glass), FOX (flowable oxide), TEOS (tetra-ethyl-orthosilicate), or HDP-CVD (high density plasma chemical vapor deposition) oxide.

The first and second gate structures 140 and 240 may be formed on the first and second active fins 105 and 205, respectively. The first gate structures 140 may cross over the first active fins 105 and may extend in a second direction, e.g., the X-direction. The second gate structures 240 may cross over the second active fins 205 and may also extend in the second direction. The first and second gate structures 140 and 240 may surround upper surfaces and sidewalls of the first and second active fins 105 and 205, respectively. A first channel region and a second channel region may be formed in the upper portions and sidewalls of the first and second active fins 105 and 205 at locations where the first and second gate structures 140 and 240 cross over the respective first and second active fins 105 and 205. The first gate structures 140 may be spaced apart from each other by a first distance SG1 and the second gate structures 240 may be spaced apart from each other by a second distance SG2. The first distance SG1 may be substantially the same as the second distance SG2. As used herein, the term "substantially the same" means a deviation of less than 10%. Throughout the specification, if a value A is said to be substantially equal to a value B, then the deviation of value A from value B is less than 10% of value A.

In some example embodiments, the first gate structures 140 and the second gate structures 240 may or may not extend parallel to each other.

Each of the first gate structures 140 may include a first gate dielectric layer 142, a first lower gate electrode 145, and a first upper gate electrode 147. The first gate dielectric layer 142 may be disposed between the first active fins 105 and the first lower gate electrode 145. The first gate dielectric layer 142 may also include portions that extend upwardly along sidewalls of the first spacers 150a. The first upper gate electrodes 147 may be formed on the respective first lower gate electrodes 145.

Each of the second gate structures 240 may include a second gate dielectric layer 242, a second lower gate electrode 245, and a second upper gate electrode 247. The second gate dielectric layer 242 may be disposed between the second active fins 205 and the second lower gate electrode 245. Some portions of the second gate dielectric layer 242 may extend upwardly along sidewalls of the second spacers 250a. The second upper gate electrodes 247 may be formed on the respective second lower gate electrodes 245.

The first and second gate dielectric layers 142 and 242 may include silicon oxide, silicon nitride, or a high-k dielectric material. The high-k dielectric material may have a dielectric constant higher than that of a silicon dioxide ($SiO_2$) layer. For example, the high-k dielectric material may include aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and/or praseodymium oxide ($Pr_2O_3$).

The first and second lower gate electrodes 145 and 245 may include, for example, titanium nitride (TiN), tantalum nitride (TaN), tungsten nitride (WN), titanium aluminum nitride (TiAlN), titanium aluminum (TiAl), tantalum carbide (TaC) and/or titanium carbide (TiC). The first and second upper gate electrodes 147 and 247 may include, for example, aluminum (Al), tungsten (W), molybdenum (Mo) and/or other metals. In some example embodiments, the first and second upper gate electrodes 147 and 247 may include one or more semiconductor materials such as, for example, doped polysilicon.

First spacers 150a may be disposed on opposed sides of each of the first gate electrodes 140. The first spacers 150a may extend along the respective sidewalls of the first gate electrodes 140 and on an upper surface of the first active fins 105. The first spacers 150a may have L-shaped cross-sections. The dielectric layer 154a may be formed along an upper surface of the first spacers 150a (e.g., on the upper surface of the lower portion of the L-shaped cross-section) and on sidewalls of the first spacers 150a. The dielectric layer 154a may also extend onto upper surfaces of the first embedded source/drain regions 110 which are disposed on opposed sides of the first gate structures 140. The dielectric layer 154a may be formed conformally on the first spacers 150a and on the first embedded source/drain regions 110 to have a uniform thickness. Portions of the first spacers 150a that are formed along the upper surface of the first active fins 105 may have a first length Xa in the Y direction. The length Xa may be substantially equal to the sum of a first thickness X1 of a corresponding one of the first spacers 150a that is on the sidewall of the first gate structure 140 and a second thickness X2 of the dielectric layer 154a that is on the sidewall of the first spacer 150a, as shown in the first callout in FIG. 2.

Second spacers 250a may be disposed on opposed sides of each of the second gate structures 240. The second spacers 250a may extend along the respective sidewalls of the second gate structures 240 and on an upper surface of the second active fins 205. The second spacers 250a may have L-shaped cross-sections. The third spacers 254a may be formed along upper surfaces of the respective second spacers 250a (e.g., on the upper surface of the lower portion of the L-shaped cross-section) and on sidewalls of the respective second spacers 250a. The third spacers 254a may also have L-shaped cross-sections. Portions of the second spacers 250a that are formed along the upper surface of the second active fins 205 may have a third length Xc in the Y direction. The third length Xc may be greater than a sum of a third thickness X3 of a corresponding one of the second spacers 250a that is on the sidewall of the second gate structures 240 and the fourth thickness X4 of a corresponding one of the third spacers 254a that is on a sidewall of the second spacer 250a, as shown in the second callout in FIG. 2.

A sum of the first thickness X1 of one of the first spacers 150a and the second thickness X2 of the dielectric layer 154a may be substantially equal to the sum of the third thickness X3 of one of the second spacers 250a and the forth thickness X4 of one of the third spacers 254a. Herein, the thicknesses of the first spacers 150a, the dielectric layer 154a, the second spacers 250a and the third spacers 254a refers to the thickness in a direction that is parallel to the upper surface of the substrate 101 and perpendicular to the direction in which the corresponding gate structure 140 or 240 extends (i.e., the Y direction in FIGS. 1 and 2). In some example embodiments, the first thickness X1 of each of the first spacers 150a may be substantially equal to the third thickness X3 of each of the second spacers 250a and the second thickness X2 of the dielectric layer 154a may be substantially equal to the fourth thickness X4 of each of the third spacers 254a.

In some example embodiments, the first distance SG1 between adjacent first gate structures 140 may be substantially equal to the second distance SG2 between adjacent second gate structures 240. In some example embodiments, a distance S1' between portions of the dielectric layer 154a which face each other on sidewalls of adjacent ones of the first gate structures 140 may be substantially equal to a distance ST between the third spacers 254a which face each other on sidewalls of adjacent ones of the second gate structures 240.

The first spacers 150a, the dielectric layer 154a, the second spacers 250a, and the third spacers 254a may include silicon oxide, silicon nitride, and/or silicon oxynitride. The first spacers 150a may be formed of substantially the same material as the second spacers 250a. The dielectric layer 154a may be formed of substantially the same material as the third spacers 254a. The first spacers 150a may be formed of a different material which has a different dielectric constant from the dielectric layer 154a or the third spacers 254a. The second spacers 250a may be formed of a different material which has a different dielectric constant from the dielectric layer 154a or the third spacers 254a. In some example embodiments, the first spacers 150a have a dielectric constant less than that of the dielectric layer 154a and the second spacers 250a may have a dielectric constant less than that of the third spacers 254a. In some example embodiments, the first spacers 150a and the second spacers 250a may include silicon oxide and the dielectric layer 154a and the third spacers 254a may include silicon nitride. In some example embodiments, the first spacers 150a and the second spacers 250a may include silicon oxynitride having a lower nitrogen concentration. The dielectric layer 154a and the third spacers 254a may include silicon oxynitride having a relatively higher nitrogen concentration than the first spacers 150a and the second spacers 250a.

The first embedded source/drain regions 110 may be formed on the first active fins 105 that are disposed at opposed sides of the first gate structures 140. The first embedded source/drain regions 110 may be source/drain regions of the first transistors 100A. In some example embodiments, each of the first active fins 105 may have recessed regions and the first embedded source/drain regions 110 may be formed in the respective recessed regions. In some example embodiments, each of the first embedded source/drain regions 110 may have elevated upper surfaces that are higher above the upper surface of the substrate 101 than are the upper surfaces of the first active fins 105. Some of the first embedded source/drain regions 110 may have a merged structure such that they connect to each other on the first active fins 105. The first embedded source/drain regions 110 may be formed by a selective epitaxial growth (SEG) process. In some example embodiments, the first embedded source/drain regions 110 may comprise silicon (Si) or silicon carbide (SiC) that is highly doped with an N-type impurity. An uppermost portion of each first embedded source/drain region 110 may comprise undoped silicon.

The second embedded source/drain regions 210 may be formed on the second active fins 205 that are disposed on opposed sides of the second gate structures 240. The second embedded source/drain regions 210 may be source/drain regions of the second transistors 100B. Upper surfaces of the second embedded source/drain regions 210 may be at a height above the upper surface of the substrate 101 that is substantially the same as the height of the bottom surfaces of the second gate structures 240 above the upper surface of the substrate 101. In other example embodiments, the second embedded source/drain regions 210 may have an elevated structure so that the upper surfaces of the second embedded source/drain regions 210 are higher above the upper surface of the substrate 101 than are bottom surfaces of the second gate structures 240. Some of the second embedded source/drain regions 210 may have a merged structure such that they connect to each other on the second active fins 205. In some example embodiments, the second embedded source/drain regions 210 may be formed by a selective epitaxial growth (SEG) process. In some example embodiments, the second embedded source/drain regions 210 may comprise silicon germanium (SiGe) that is highly doped with a P-type impurity. The second embedded source/drain regions 210 that include silicon germanium (SiGe) may impart a compressive stress on the second active fins 205 that are formed of silicon (Si). Thereby, the mobility of holes may be increased in the channel region of the second active fins 205. The second embedded source/drain regions 210 may include several regions having different germanium (Ge) concentrations from each other.

A first etch stop layer 158 having a uniform thickness may be conformally formed on the dielectric layer 154a in the first region I. A second etch stop layer 258 may be conformally formed in the second region II. The second etch stop layer 258 may have a substantially uniform thickness on the third spacers 254a and the second embedded source/drain regions 210. The first and second etch stop layers 158 and 258 may include silicon nitride, silicon oxynitride or a mixture thereof. The thickness of the first etch stop layer 158 may be substantially equal to the thickness of the second etch stop layer 258.

In some example embodiments, the first distance SG1 between the first gate structures 140 may be substantially equal to the second distance SG2 between the second gate structures 240. A first gap S1 between portions of the first etch stop layer 158 which face each other on sidewalls of adjacent ones of the first gate structures 140 may be substantially equal to a second gap S2 between portions of the second etch stop layer 258 which face each other on sidewalls of adjacent ones of the second gate structures 240.

First and second interlayer insulating layers 162 and 262 may be formed on the respective first and second etch stop layers 158 and 258. The first and second interlayer insulating layers 162 and 262 may include BPSG (boro-phospho-silicate glass), TOSZ (tonen silazene), USG (undoped silicate glass), SOG (spin on glass), FOX (flowable oxide), TEOS (tetra-ethyl-ortho-silicate), or HDP-CVD (high density plasma-CVD) oxide.

FIGS. 3 through 13 are cross-sectional views illustrating a method of manufacturing the semiconductor device 100 of FIGS. 1 and 2. FIGS. 3 through 13 are cross-sectional views taken along lines A-A' and B-B' of FIG. 1.

Figure 3:
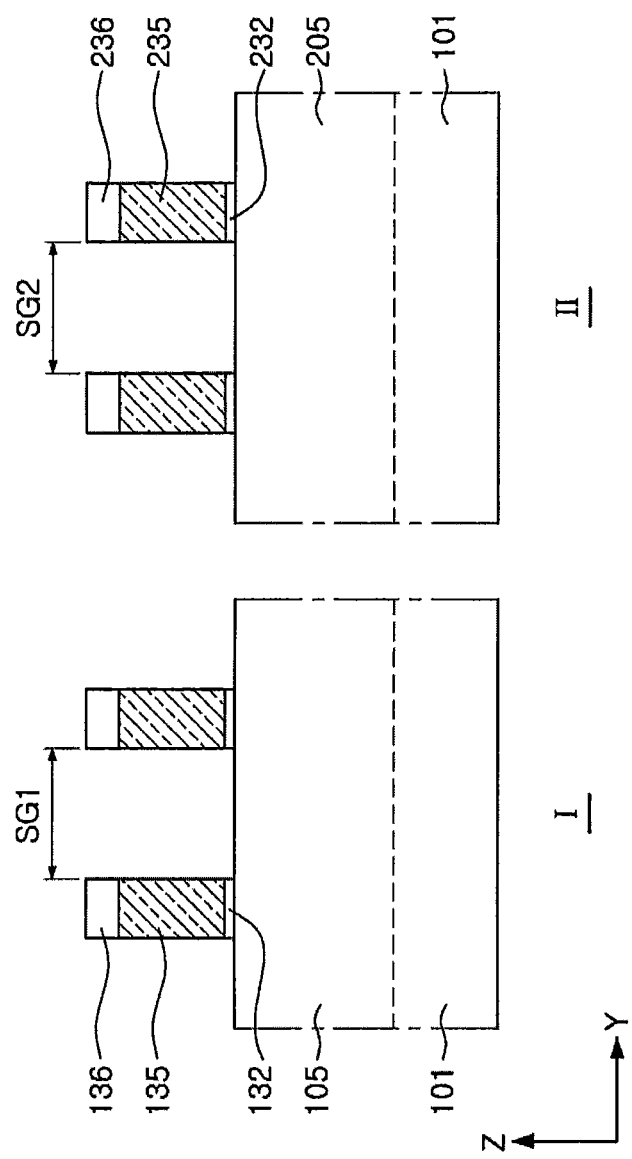
FIGS. 3 through 13 are perspective and cross-sectional views illustrating a method of manufacturing the semiconductor device of FIGS. 1 and 2.

Referring to FIG. 3, the substrate 101 includes the first region I and the second region II. A plurality of first active fins 105 are formed in the first region I and a plurality of first sacrificial gate structures are formed on the first active fins 105. The first sacrificial gate structures may include a first sacrificial gate dielectric layer 132, a first sacrificial gate 135, and a first gate mask pattern 136 which are stacked sequentially. The first sacrificial gate structures may be spaced apart from each other by the first distance SG1. A plurality of second active fins 205 are formed in the second region II and a plurality of second sacrificial gate structures are formed on the second active fins 205. The second sacrificial gate structures may include a second sacrificial gate dielectric layer 232, a second sacrificial gate 235, and a second gate mask pattern 236 which are stacked sequentially. The second sacrificial gate structures may be spaced apart from each other by the second distance SG2. The first distance SG1 may be substantially equal to the second distance SG2.

The first and second active fins 105 and 205 may be formed in the first and second region I and II, respectively, by etching the substrate 101 using a mask pattern as an etch mask. A plurality of trenches may be formed in the first and second active fins 105 and 205, respectively. A device isolation region may be formed in the trenches. Upper portions of the first and second active fins 105 and 205 may protrude from an upper surface of the device isolation region.

In some example embodiments, the first and second sacrificial gate dielectric layers 132 and 232 may include silicon oxide and the first and second sacrificial gates 135 and 235 may include polysilicon.

Figure 4:
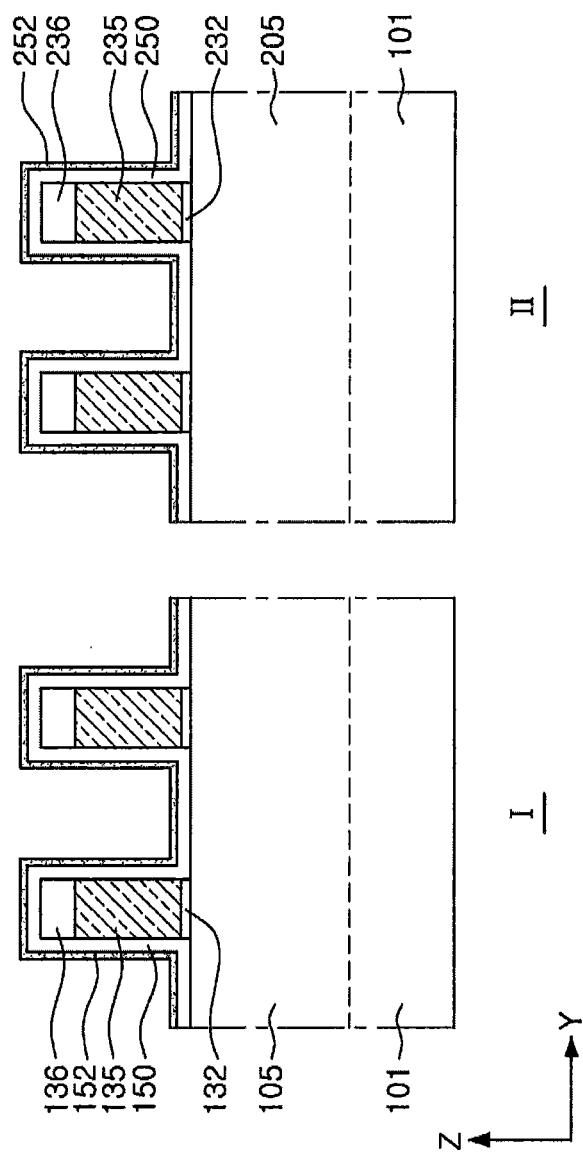

Referring to FIG. 4, first insulating layers 150 and 250 may be formed on the first and second active fins 105 and 205, respectively. Second insulating layers 152 and 252 may be formed on the first insulating layers 150 and 250, respectively. The second insulating layers 152 and 252 may have etch selectivity with respect to the first insulating layers 150 and 250. In some example embodiments, the first insulating layers 150 and 250 may include silicon nitride or silicon oxynitride and the second insulating layers 152 and 252 may include silicon oxide. The first and second insulating layers 150, 250, 152, and 252 may be formed by atomic layer deposition (ALD).

Figure 5:
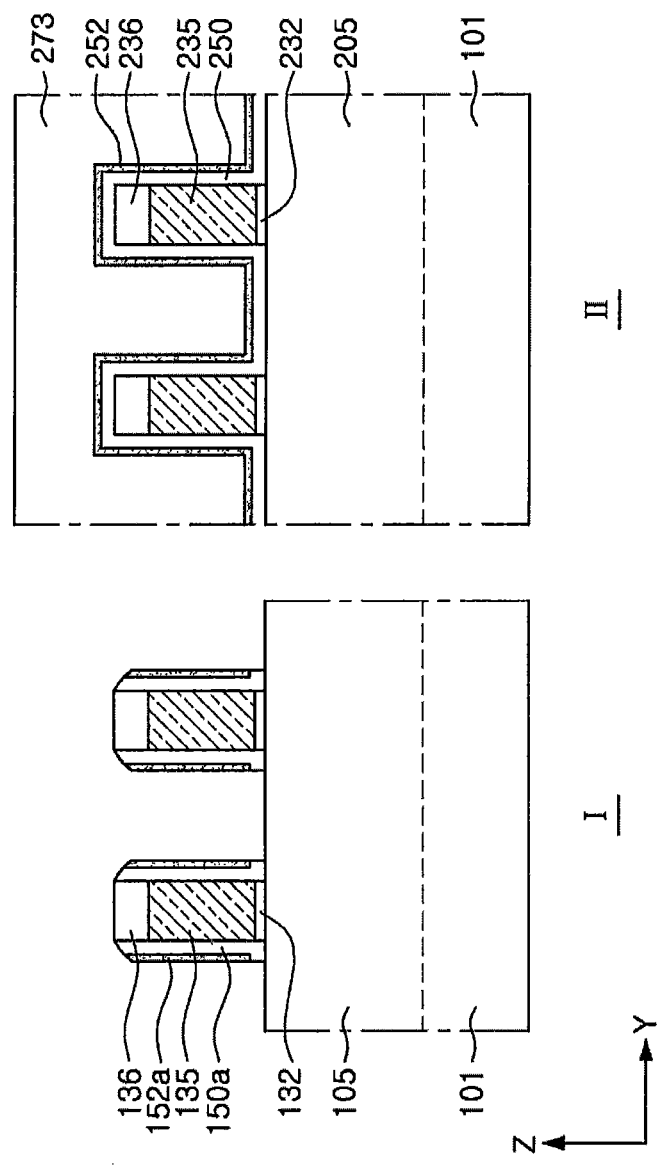

Referring to FIG. 5, first preliminary spacers may be formed on opposed sides of the first sacrificial gate structures. The first preliminary spacers may be double-layered structures that each include a first spacer 150a and a first sacrificial spacer 152a.

The first sacrificial spacers 152a may be formed on the first insulating layer 150 by performing an etch back process on the second insulating layer 152 after forming a mask pattern 273 that covers the second region. The mask pattern 273 may be a photo resist pattern. The first spacers 150a may be formed on opposed sides of each first sacrificial gate structure by performing an etch back process on the first insulating layer 150. Each first spacer 150a may have an L-shaped cross-section and may be formed along an upper surface of one of the first active fins 105 and along a sidewall of one of the first sacrificial gate structures. First preliminary spacers may be formed on opposed sides of each of the first sacrificial gate structures. A length of the first spacers 150a along the upper surface of the first active fins 105 (i.e., in the Y direction) may be a sum of the thicknesses of the first sacrificial spacer 152a and the first insulating layer 150 in the Y direction.

The mask pattern 273 covering the second region II may be removed after the first preliminary spacers are formed. The first insulating layer 250 and the second insulating layer 252, which are formed in the second region II, may remain after the mask pattern 273 is removed.

Figure 6:
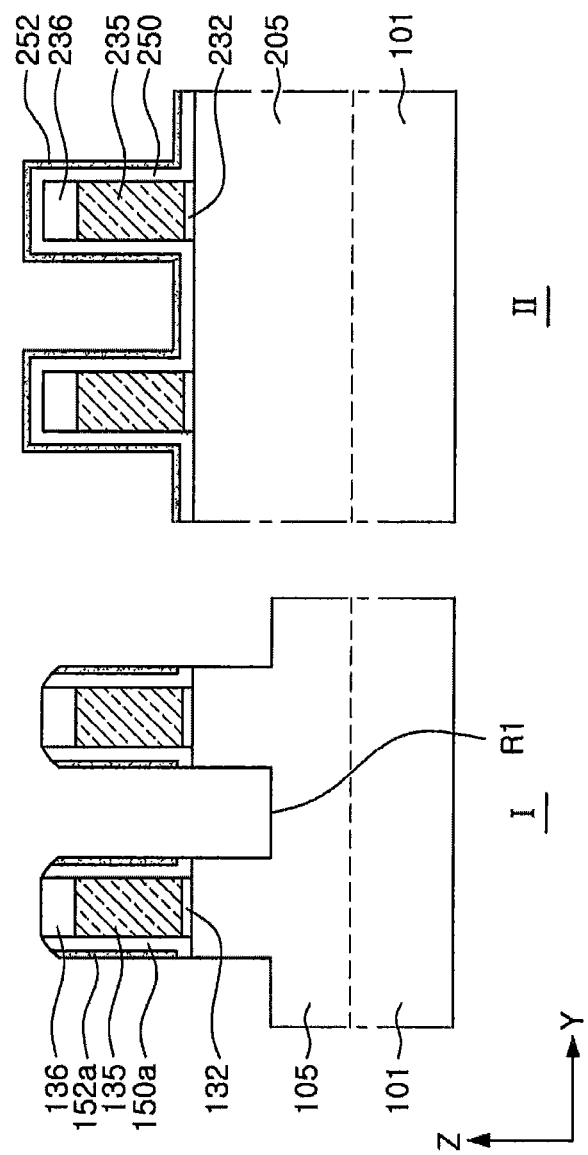

Referring to FIG. 6, first recess regions R1 may be formed in the first region I by removing upper portions of the first active fins 105 that are disposed on opposed sides of the first sacrificial gate structures using an anisotropic etching process. In some example embodiments, an additional isotropic etching process may be performed to extend the first recess regions R1 laterally under the first spacers 150a.

Figure 7:
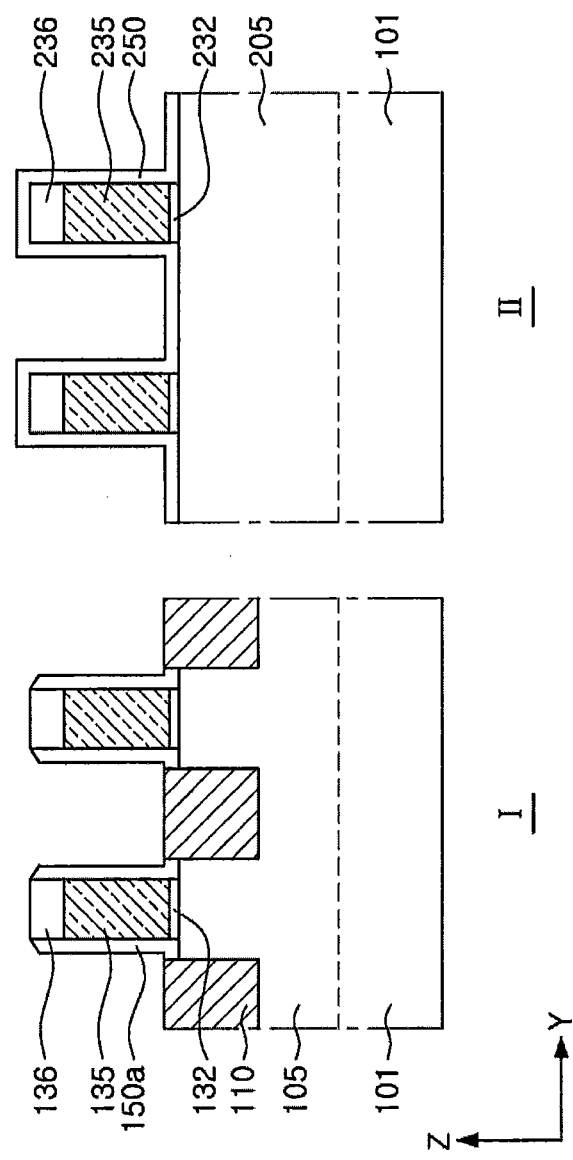

Referring to FIG. 7, a plurality of first embedded source/drain regions 110 may be formed on opposed sides of each of the first sacrificial gate structures in the first region I.

A pre-cleaning process may first be performed on the first recess regions R1. The pre-cleaning process may be performed using a wet cleaning process and/or a dry cleaning process. The wet cleaning process may include an isotropic etching process using a diluted hydro fluoride (HF) solution or a buffered oxide etchant (BOE). The dry cleaning process may include a dry etching process, e.g., Siconi™, using an ammonia ($NH_3$) gas and/or a nitrogen trifluoride ($NF_3$) gas. The second insulating layer 252 and the first sacrificial spacers 152a may be removed by the pre-cleaning process. The removal of the first sacrificial spacers 152a may expose sidewalls of the first spacers 150a in the first region I. The first insulating layer 250 may remain on the second sacrificial gate structures and on the second active fins 205 in the second region II.

The first embedded source/drain regions 110 may be formed to fill the first recess regions R1 using a selective epitaxial growth (SEG) process. The first insulating layer 250 formed on the second region II may act as a blocking layer during the selective epitaxial growth (SEG) process. An upper surface of the first embedded source/drain regions 110 may be at a higher level above the upper surface of the substrate 101 than are upper surfaces of the first active fins 105. However, embodiments of the inventive concepts are not limited thereto. In some example embodiments, the first embedded source/drain regions 110 may comprise silicon (Si). The first embedded source/drain regions 110 may be in-situ doped with an N-type impurity, e.g., phosphorus (P), during the SEG process. An upper portion of the first embedded source/drain regions 110 may comprise undoped silicon (Si). The undoped silicon may be formed by stopping the supply of the N-type impurity during a final step of the SEG process. Some of the first embedded source/drain regions 110 may be merged with at least adjacent ones of the first embedded source/drain regions 110. In other example embodiments, the first embedded source/drain regions 110 may be formed using a molecular beam epitaxy (MBE) process, a chemical vapor deposition (CVD) process, a reduced pressure chemical vapor deposition (RPCVD) process, or an ultra high vacuum chemical vapor deposition (UHV CVD) process.

Figure 8:
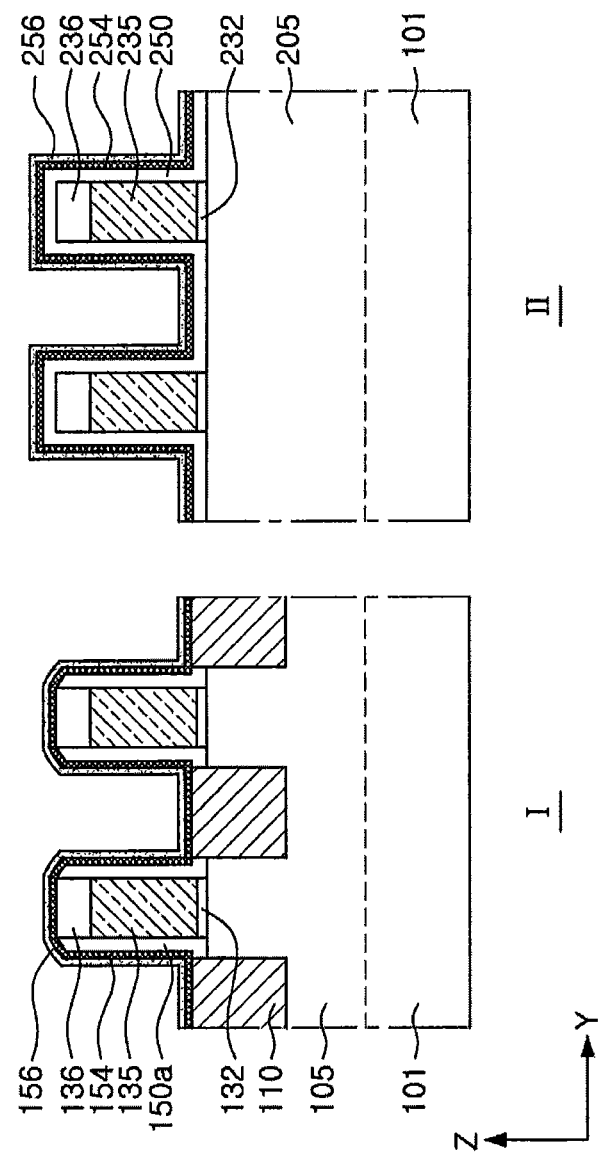

Referring to FIG. 8, third insulating layers 154 and 254 may be formed on the substrate 101 to cover the first spacers 150a and the first insulating layer 250, respectively. Fourth insulating layers 156 and 256 may be formed on the third insulating layers 154 and 254, respectively. The fourth insulating layers 156 and 256 may have etch selectivity with respect to the third insulating layers 154 and 254. For example, the third insulating layers 154 and 254 may include silicon nitride and the fourth insulating layers 156 and 256 may include silicon oxide. The third and fourth insulating layers 154, 254, 156, and 256 may be formed using, for example, an atomic layer deposition (ALD) process.

Figure 9:
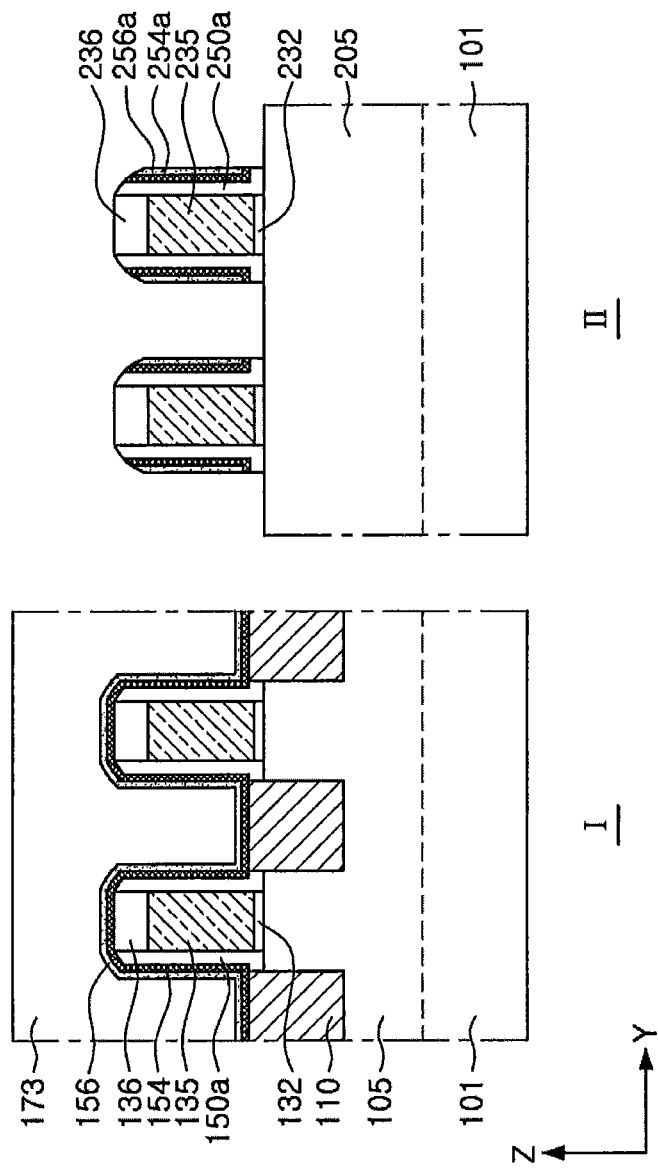

Referring to FIG. 9, second preliminary spacers may be formed on opposed sides of the second sacrificial gate structures in the second region II. The second preliminary spacers may be triple-layered structures that each include a second spacer 250a, a third spacer 254a, and a second sacrificial spacer 256a.

The second sacrificial spacer 256a may be formed on the third insulating layer 254 by performing an etch back process on the fourth insulating layer 256 after forming a mask pattern 173 in the first region I. The mask pattern 173 may be a photo resist pattern. The second spacers 250a and the third spacers 254a may be formed on opposed sides of each second sacrificial gate structure by performing an etch back process on the third insulating layer 254 and on the first insulating layer 250. The second spacers 250a may have L-shaped cross-sections and may extend along respective upper surfaces of the second active fin 205 and along respective sidewalls of the second sacrificial gate structures. The third spacers 254a may have L-shaped cross-sections and may extend along upper surfaces and sidewalls of the second spacers 250a. The second preliminary spacers including the second spacers 250a, the third spacers 254a, and the second sacrificial spacer 256a may be formed on opposed sides of each second sacrificial gate structures. A length of each second spacer 250a in the Y-direction along the upper surface of the second active fin 205 may be a sum of the thicknesses of the second spacers 250a, the third spacers 254a and the second sacrificial spacer 256a. In other words, a length of the second spacers 250a formed along the upper surface of the second active fin 205 may be determined by a sum of the thicknesses of the first insulating layer 250, the third insulating layer 254, and the fourth insulating layer 256.

The mask pattern 173 covering the first region I may be removed. The third insulating layer 154 and the fourth insulating layer 156, which are formed in the first region I, may remain after the mask pattern 173 is removed.

Figure 10:
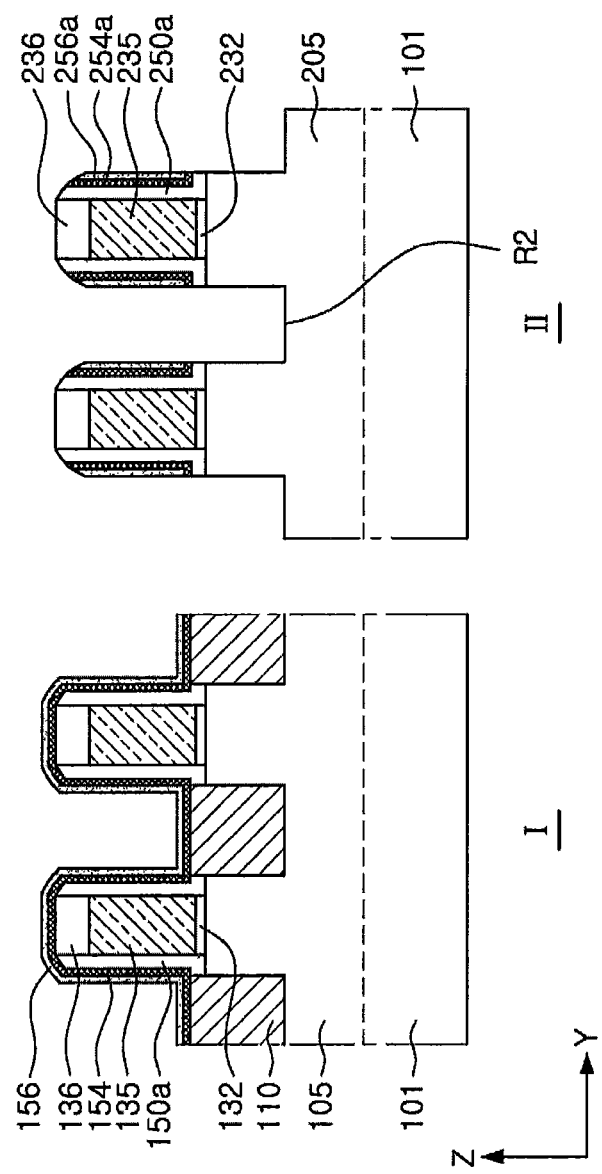

Referring to FIG. 10, second recess regions R2 may be formed in the second region II by removing upper portions of the second active fins 205 on opposed sides of the second sacrificial gate structures using an anisotropic etching process. In some example embodiments, an isotropic etching process may be performed to extend the second recess regions R2 laterally under the second spacers 250a.

Figure 11:
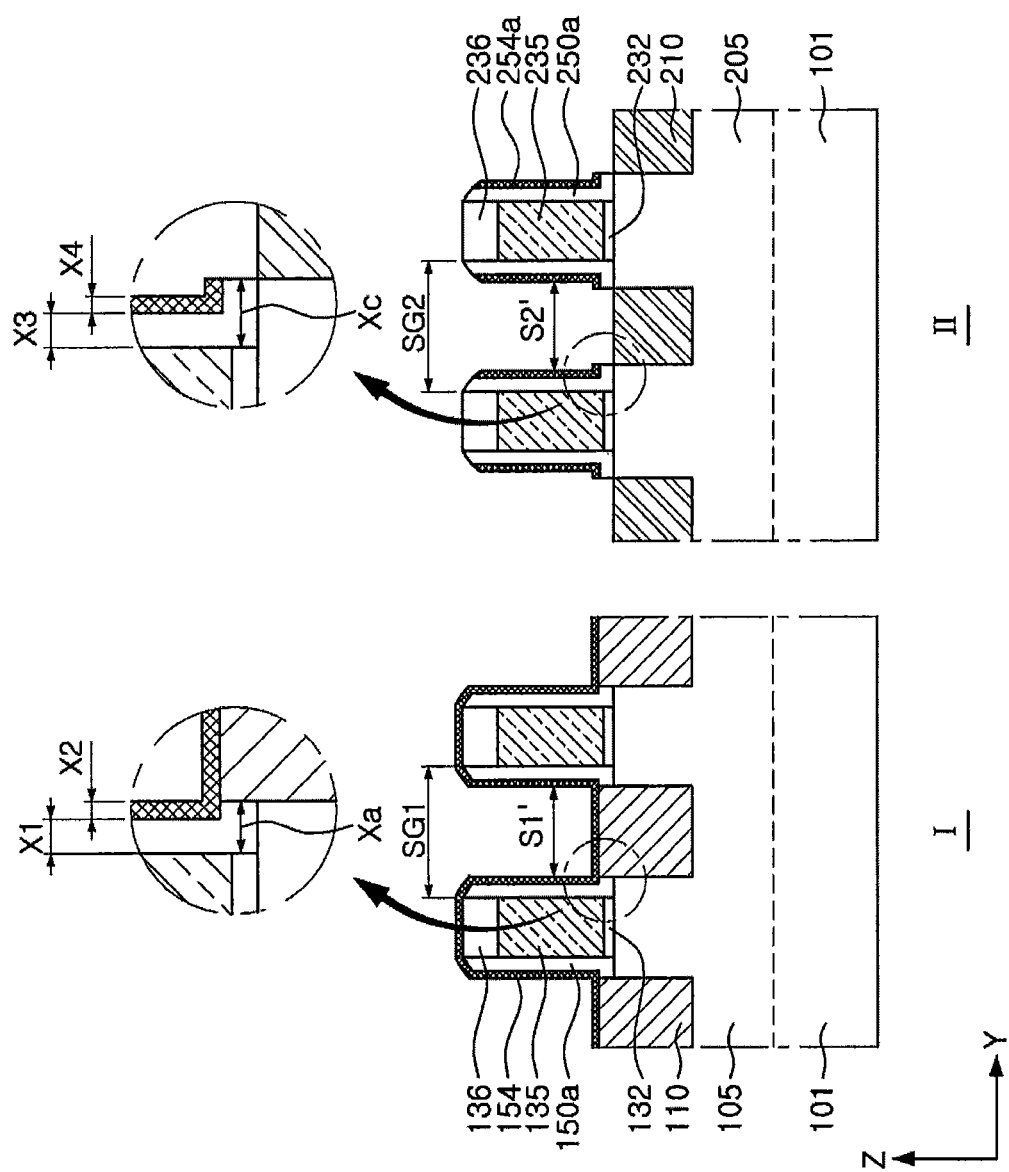

Referring to FIG. 11, a plurality of second embedded source/drain regions 210 may be formed on opposed sides of the second sacrificial gate structures in the second region II.

A pre-cleaning process may be performed on the second recess regions R2. The pre-cleaning process may be performed using a wet cleaning process and/or a dry cleaning process. The wet cleaning process may include an isotropic etching process using a diluted hydro fluoride (HF) solution or a buffered oxide etchant (BOE). The dry cleaning process may include a dry etching process, e.g., Siconi™, using an ammonia ($NH_3$) gas and/or a nitrogen trifluoride ($NF_3$) gas. The fourth insulating layer 156 and the second sacrificial spacers 256a may be removed by the pre-cleaning process. The second spacers 250a and the third spacers 254a may remain on opposed sides of the second sacrificial gate structures in the second region II and the first spacers 150a and the third insulating layer 154 may remain on opposed sides of the first sacrificial gate structures. The third insulating layer 154 may also cover upper surfaces of the first embedded source/drain regions 110 in the first region I. The third insulating layer 154 may act as a blocking layer which may prevent growth of an epitaxial layer on the first embedded source/drain regions 110 during a selective epitaxial growth (SEG) process that is performed to grow second embedded source/drain regions 210 in the second recess region II. The first spacers 150a may extend a first length Xa along the upper surface of the first active fins 105 (i.e., in the Y direction). The first length Xa may be substantially equal to the sum of the first thickness X1 of one of the first spacers 150a and the second thickness X2 of one of the third insulating layers 154. The second spacers 250a may extend a third length Xc along the upper surface of the second active fins 205 (i.e., in the Y direction). The third length Xc may be greater than the sum of the third thickness X3 of one of the second spacers 250a and the fourth thickness X4 of one of the third spacers 254a.

A sum of the first thickness X1 of one of the first spacers 150a and the second thickness X2 of the third insulating layer 154 may be substantially equal to the sum of the third thickness X3 of one of the second spacers 250a and the forth thickness X4 of one of the third spacers 254a. In some example embodiments, the first thickness X1 of the first spacers 150a may be substantially equal to the third thickness X3 of the second spacers 250a and the second thickness X2 of the third insulating layer 154 may be substantially equal to the fourth thickness X4 of the third spacers 254a. In some example embodiments, the first distance SG1 between sidewalls of adjacent ones of the first gate structures 140 which face each other may be substantially equal to the second distance SG2 between sidewalls of adjacent ones of the second gate structures 240 which face each other. A distance Si' between portions of the third insulating layer 154 that are on sidewalls of adjacent ones of the first gate structures 140 may be substantially equal to a distance S2' between the third spacers 254a that are on sidewalls of adjacent ones of the second gate structures 240.

The second embedded source/drain regions 210 may be formed using a selective epitaxial growth (SEG) process to grow an epitaxial layer in the second recess regions R2. The upper surfaces of the second embedded source/drain regions 210 may be coplanar with the upper surfaces of the second active fins 205. However, embodiments of the inventive concepts are not limited thereto. For example, in other example embodiments, upper surfaces of the second embedded source/drain regions 210 may be positioned above the upper surfaces of the second active fins 205.

The second embedded source/drain regions 210 may comprise silicon germanium (SiGe). The second embedded source/drain regions 210 may be in-situ doped with a P-type impurity, e.g., boron (B), during the SEG process. An upper portion of the second embedded source/drain regions 210 may have a higher germanium (Ge) concentration than a lower portion of the second embedded source/drain regions 210 by controlling an injection level of germanium (Ge) during the SEG process. Some of the second embedded source/drain regions 210 may be merged with adjacent ones of the second embedded source/drain regions 210. In other example embodiments, the second embedded source/drain regions 210 may be formed using a molecular beam epitaxy (MBE) process, a chemical vapor deposition (CVD) process, a reduced pressure chemical vapor deposition (RPCVD) process, or an ultra high vacuum chemical vapor deposition (UHV CVD) process.

Figure 12:
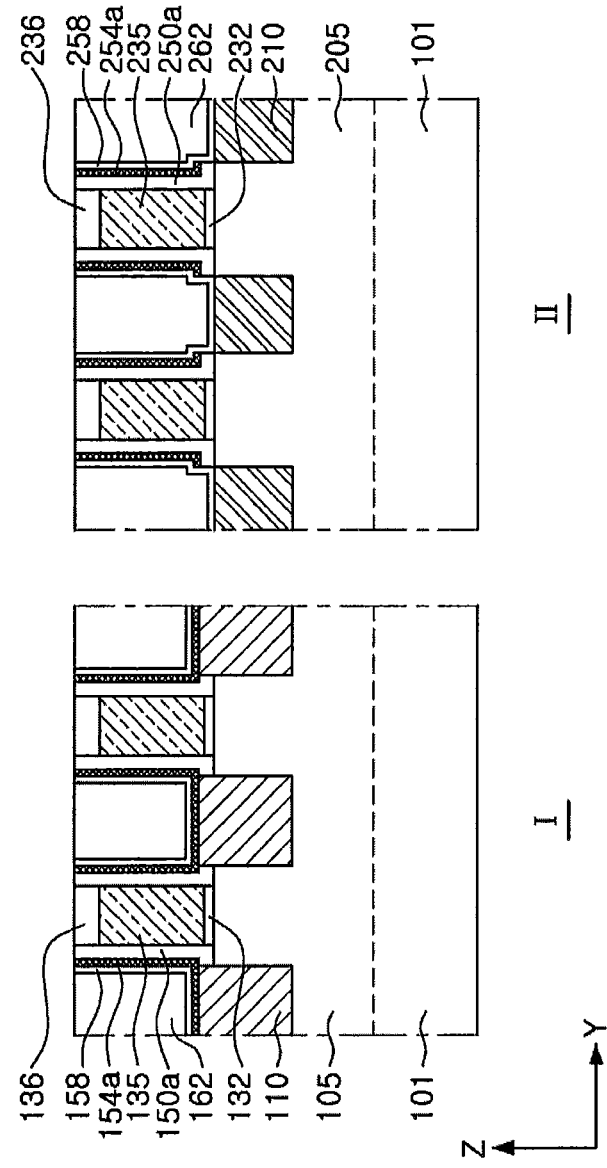

Referring to FIG. 12, first and second etch stop layers 158 and 258 may be formed on the respective first and second regions I and II to cover the upper surfaces of the dielectric layer 154a and the third spacers 254a, respectively. A first interlayer insulating layer 162 and a second interlayer insulating layer 262 may be formed on the respective first and second etch stop layers 158 and 258.

The first etch stop layer 158 may be conformally formed on the third insulating layer 154 and may have a uniform thickness. The second etch stop layer 258 may be conformally formed on upper surfaces of the third spacers 254a, the second sacrificial gate structures, and the second embedded source/drain regions 210. The first and second etch stop layers 158 and 258 may include silicon nitride, silicon oxynitride, or the mixture thereof. The thickness of the first etch stop layer 158 may be substantially equal to the thickness of the second etch stop layer 258. The first and second etch stop layers 158 and 258 may be formed using, for example, an atomic layer deposition (ALD) process.

A planarization process may be performed on the first and second interlayer insulating layers 162 and 262 and on the first and second etch stop layers 158 and 258 to expose upper surfaces of the first and second sacrificial gate structures. Upper portions of the first and second gate mask patterns 136 and 236 may be removed during the planarization process. In some example embodiments, the first and second gate mask patterns 136 and 236 may be completely removed during the planarization process. The third insulating layer 154 may be partially removed via the planarization process to form the dielectric layer 154a.

The first and second interlayer insulating layers 162 and 262 may include BPSG (boro-phospho-silicate glass), TOSZ (tonen silazene), USG (undoped silicate glass), SOG (spin on glass), FOX (flowable oxide), TEOS (tetra-ethyl-orthosilicate), or HDP-CVD (high density plasma-CVD) oxide. The first and second interlayer insulating layers 162 and 262 may be formed using a chemical vapor deposition process, a plasma enhanced-CVD (PE-CVD), a spin coating process, or an ALD process.

Figure 13:
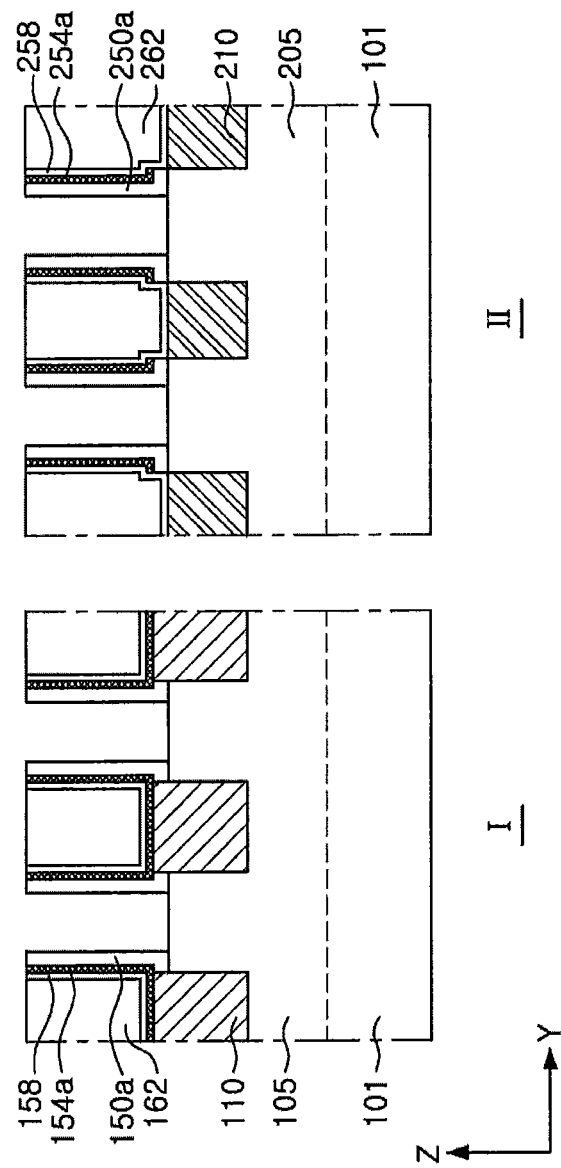

Referring to FIG. 13, the first and second gate mask patterns 136 and 236, the first and second sacrificial gates 135 and 235, and the first and second sacrificial gate dielectric layers 132 and 232 may be removed to form a plurality of openings that expose upper surfaces of the first and second active fins 105 and 205. The openings may be formed by using a dry etch process and/or a wet etch process.

Referring to FIG. 2 again, the first and second gate dielectric layers 142 and 242 may be formed on the first and second active fins 105 and 205 which are exposed by the openings, respectively. The first and second lower gate electrodes 145 and 245 may be formed on the first and second gate dielectric layers 142 and 242, respectively. The first and second upper gate electrodes 147 and 247 may be formed on the first and second lower gate electrodes 145 and 245, respectively. First gate structures 140 that each include a first gate dielectric layer 142, a first lower gate electrode 145, and a first upper gate electrode 147 may be formed in the first region I after performing a planarization process. Second gate structures 240 that each include a second gate dielectric layer 242, a second lower gate electrode 245, and a second upper gate electrode 247 may also be formed in the second region II after performing the planarization process. In some example embodiments, the first lower gate electrodes 145 may include a conductive material different from the second lower gate electrodes 245.

Figure 14:
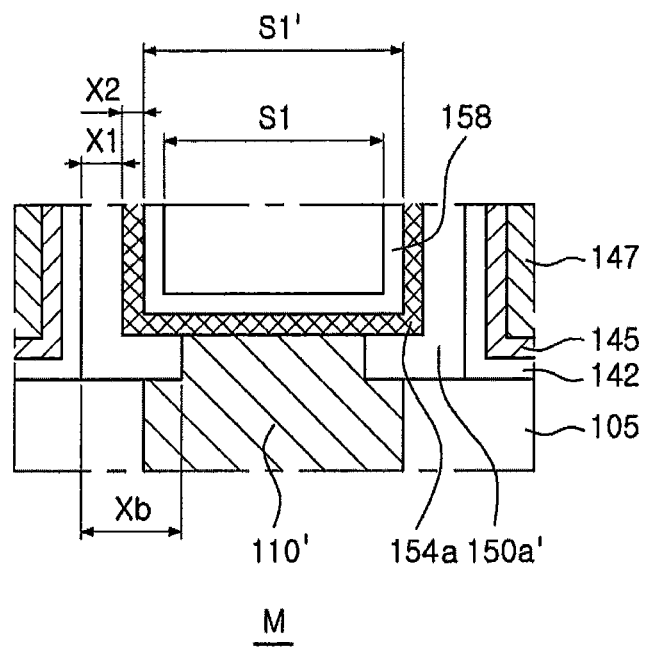
FIGS. 14 and 15 are cross-sectional views illustrating a semiconductor device according to an alternative example embodiment of the inventive concepts.
Figure 15:
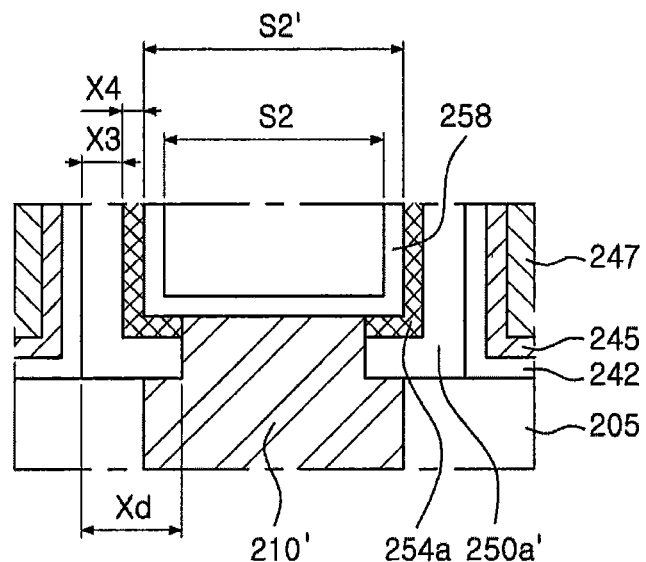

FIGS. 14 and 15 are cross-sectional views illustrating a semiconductor device according to a further example embodiment of the inventive concepts. Specifically, FIGS. 14 and 15 are enlarged views of regions M and N of FIG. 2, respectively that illustrate the modified embodiment.

Referring to FIG. 14, a second length Xb of the first spacers 150a' which are formed along the upper surface of the first active fin 105 may be greater than the first length Xa of the first spacers 150a shown in FIG. 2. The second length Xb of the first spacers 150a' may be greater than the sum of the first thickness X1 of the first spacers 150 and the second thickness X2 of the dielectric layer 154a on the sidewall of the first gate structures 140. This result may occur when the first sacrificial spacer 152a, shown in FIG. 5, is formed more thickly.

The structure of the first spacers 150a' shown in FIG. 14 may reduce a parasitic capacitance between the first gate structure 140 and the first embedded source/drain regions 110' that protrude from the upper surfaces of the first active fins 105. Some portions of the first embedded source/drain regions 110' may be formed under the first spacers 150a' in order to increase the amount of current.

Referring to FIG. 15, a fourth length Xd of the second spacers 250a' which are formed along the upper surfaces of the second active fin 205 may be greater than the third length Xc of the second spacers 250a shown in FIG. 2. This result may occur when the second sacrificial spacer 256a, shown in FIG. 9, are formed more thickly. In some example embodiments, the second embedded source/drain regions 210' may protrude from the upper surfaces of the second active fins 205. The structure of the second spacers 250a' shown in FIG. 15 may reduce a parasitic capacitance between the second gate structure 240 and the second embedded source/drain regions 210' that protrude from the upper surface of the second active fins 205. Some portions of the second embedded source/drain regions 210' may be formed under the second spacers 250a' in order to increase the amount of current.

Figure 16:
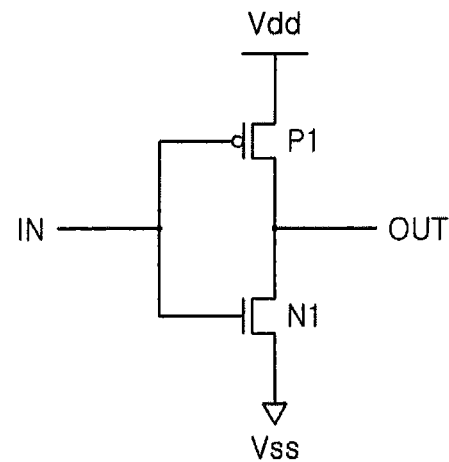
FIG. 16 is a circuit diagram illustrating an inverter including a semiconductor device according to an example embodiment of the inventive concepts.

FIG. 16 is a circuit diagram illustrating an inverter circuit that includes a semiconductor device according to an example embodiment of the inventive concepts. The semiconductor device shown in FIG. 16 may be a CMOS (Complementary Metal-Oxide-Semiconductor) inverter.

Referring to FIG. 16, the CMOS inverter may include a PMOS transistor P1 and an NMOS transistor N1. The PMOS and NMOS transistors P1 and N1 may be connected in series between a driving voltage Vdd and a ground voltage Vss. An input signal IN may be commonly input to gate electrodes of the PMOS and NMOS transistors P1 and N1. An output signal may be commonly output from the drains of the PMOS and NMOS transistors P1 and N1. The driving voltage Vdd may be supplied to the source of the PMOS transistor P1 and the ground voltage Vss may be applied to the source of the NMOS transistor N1. The CMOS inverter may output the output signal that is inverted from the input signal. Specifically, if the level of the input signal is high, the output of the CMOS inverter should be low, and if the level of the input signal is low, the output of the CMOS inverter should be high. The PMOS and NMOS transistors P1 and N1 may be manufactured according to various example embodiments of the inventive concepts as described above.

Figure 17:
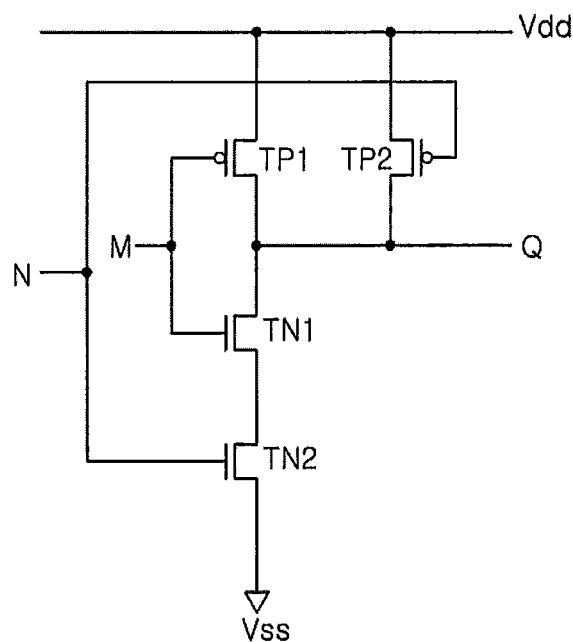
FIG. 17 is a circuit diagram illustrating a NAND gate cell including a semiconductor device according to an example embodiment of the inventive concepts.

FIG. 17 is a circuit diagram illustrating a NAND gate cell including a semiconductor device according to an example embodiment of the inventive concepts.

Referring to FIG. 17, the NAND gate cell may receive two input signals M and N and may output an output signal Q. The NAND gate cell may include a first PMOS transistor TP1, a second PMOS transistor TP2, a first NMOS transistor TN1, and a second NMOS transistor TN2. The first PMOS transistor TP1 may transfer a logical value 'high' to the output signal Q when the input signal M is 'low'. The first and second NMOS transistors TN1 and TN2 may transfer a logical value 'low' to the output signal Q when the input signals M and N are both 'high'. The second PMOS transistor TP2 may transfer a logical value 'high' to the output signal Q when the input signal N is 'low'.

The NAND gate shown in FIG. 17 may operate as follows. The first and second PMOS transistors TP1 and TP2 may be turned off and the first and second NMOS transistors TN1 and TN2 may be turned on when both of the input signals M and N have a logical value 'high'. In this case, the output signal Q may be a logical value 'low'. The first and second PMOS transistors TP1 and TP2 may be turned on and the first and second NMOS transistors TN1 and TN2 may be turned off when both of the input signals M and N are logical value 'low'. In this case, the output signal Q may be a logical value 'high'. The first and second PMOS transistors TP1 and TP2 and the first and second NMOS transistors TN1 and TN2 may be formed according to example embodiments of the inventive concepts as described above.

Figure 18:
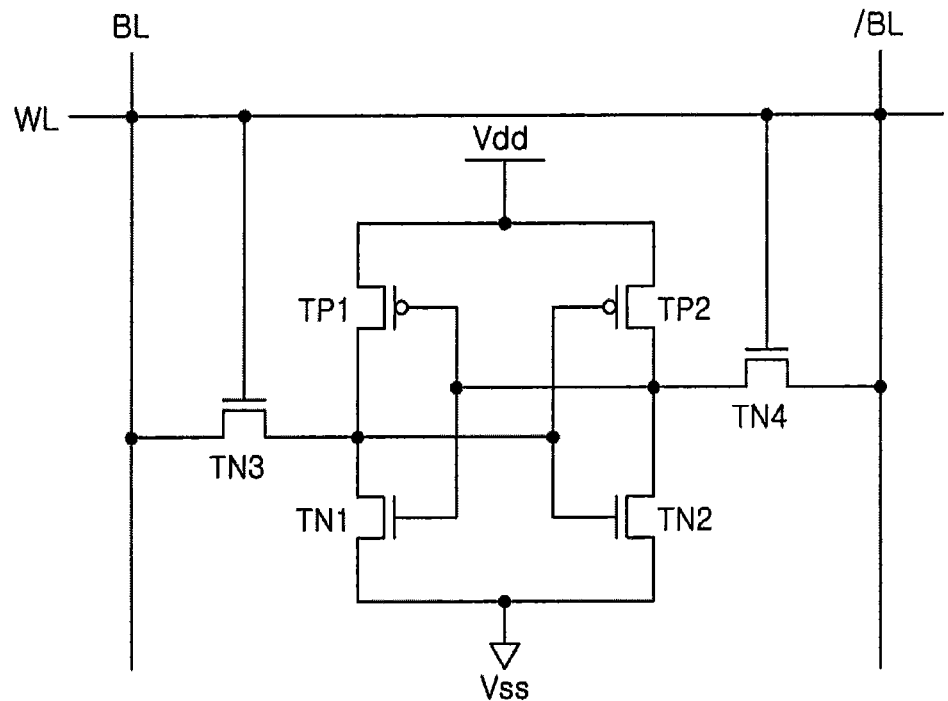
FIG. 18 is a circuit diagram illustrating a SRAM (Static Random Access Memory) unit cell according to an example embodiment of the inventive concepts.

FIG. 18 is a circuit diagram illustrating a SRAM (Static Random Access Memory) cell according to an example embodiment of the inventive concepts.

Referring to FIG. 18, the SRAM cell may have a first inverter and a second inverter which are formed between a power supply node Vdd and a ground node Vss. The first inverter may include a first pull-up transistor TP1 and a first pull-down transistor TN1. The second inverter may have a second pull-up transistor TP2 and a second pull-down transistor TN2. An input node of the first inverter may be connected to a source/drain region of a second pass transistor TN4 as well as to the output node of the second inverter. The input node of the second inverter may be connected to a source/drain region of a first pass transistor TN3 as well as to the output node of the first inverter. Gate electrodes of the first and second pass transistors TN3 and TN4 may be connected to a word line WL. A bit line BL may be connected to a source/drain region of the first pass transistor TN3. A bit line bar /BL may be connected to a source/drain region of the second pass transistor TN4. The first and second pull-up transistors TP1 and TP2 may be PMOS transistors. The first and second pull-down transistors TN1 and TN2 and the first and second pass transistors TN3 and TN4 may be NMOS transistors. The first and second pull-up transistors TP1 and TP2 may be formed according to an example embodiment of the inventive concepts.

Figure 19:
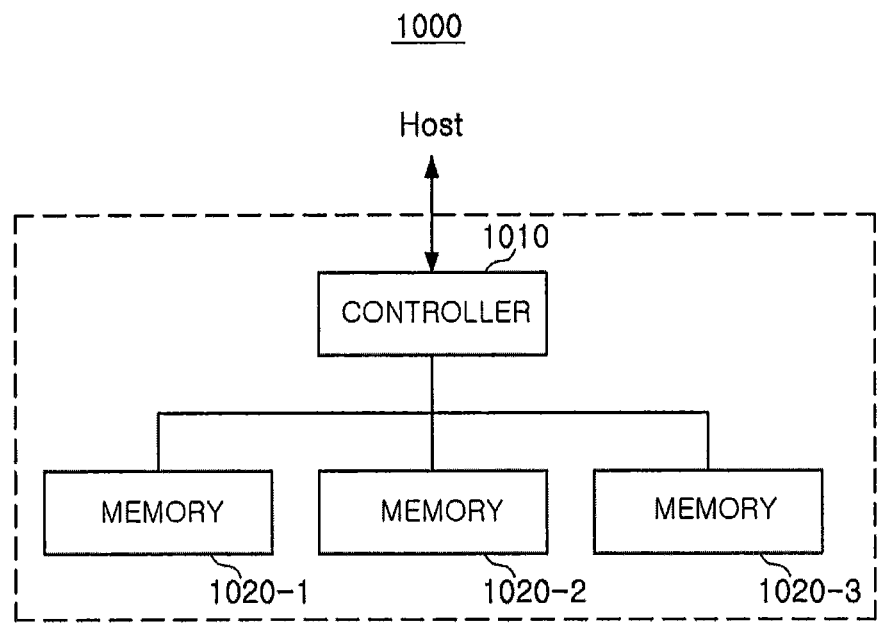
FIG. 19 is a block diagram illustrating a storage device including a semiconductor device according to an example embodiment of the inventive concepts.

FIG. 19 is a block diagram of a storage device including a semiconductor device according to an example embodiment of the inventive concepts.

Referring to FIG. 19, a storage apparatus 1000 according to the example embodiment of the inventive concepts may include a controller 1010 communicating with a Host, and memories 1020-1, 1020-2 and 1020-3 that store data. The respective memories 1020-1, 1020-2 and 1020-3 may include semiconductor devices according to various embodiments of the inventive concepts that are described above with reference to FIGS. 1 through 15.

The host may be, for example, an electronic device on which the storage apparatus 1000 is mounted. The host may be, for example, a smartphone, a digital camera, a desktop computer, a laptop computer, a portable media player or the like. The controller 1010 may receive a request from the host to store data in the memories 1020-1, 1020-2 and 1020-3 or a request to retrieve data stored in the memories 1020-1, 1020-2 and 1020-3, and may generate an appropriate read or write command in response thereto.

As illustrated in FIG. 19, at least one or more memories 1020-1, 1020-2 and 1020-3 may be connected to the controller 1010. The memories 1020-1, 1020-2 and 1020-3 may be connected to the controller 1010 in parallel to provide a storage apparatus 1000 having a high capacity such as a solid state drive.

Figure 20:
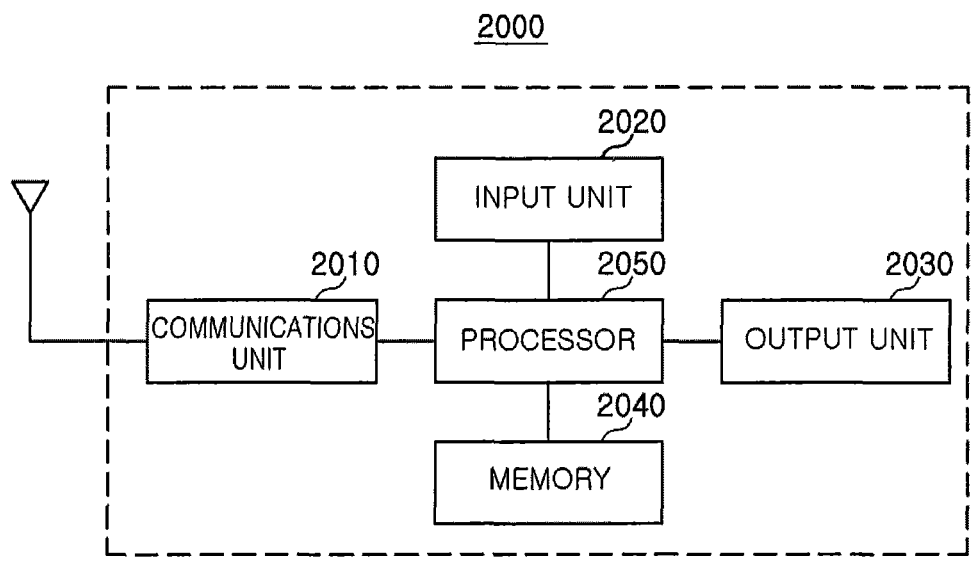
FIG. 20 is a block diagram illustrating an electronic device including a semiconductor device according to an example embodiment of the inventive concepts.

FIG. 20 is a block diagram of an electronic apparatus 2000 that includes a semiconductor device according to an example embodiment of the inventive concepts.

Referring to FIG. 20, the electronic apparatus 2000 may include a communications unit 2010, an input unit 2020, an output unit 2030, a memory 2040, and a processor 2050.

The communications unit 2010 may include a wired or wireless communications module, a wireless Internet module, a local area communications module, a global positioning system (GPS) module, a mobile communications module and the like. The wired or wireless communications module included in the communications unit 2010 may be connected to external communications networks according to various communications standards to transmit and receive data.

The input unit 2020 may control operation of the electronic apparatus 2000 in response to commands received from a user and may include one or more of a mechanical switch, a touch screen, a voice recognition module, or the like. In addition, the input unit 2020 may include a mouse operating in a track ball or a laser pointer scheme or a finger mouse device. In addition, the input unit 2020 may further include various sensor modules allowing for a user to input data thereto.

The output unit 2030 may output information processed in the electronic apparatus 2000 in a sound or image form, and the memory 2040 may store programs for the processing and the control of the processor 2050. The memory 2040 may include at least one semiconductor device according to various example embodiments of the inventive concepts as described above with reference to FIGS. 1 through 15. The processor 2050 may transfer a command to the memory 2040 according to a required operation to thereby store or retrieve data.

The memory 2040 may be embedded in the electronic apparatus 2000 to communicate with the processor 2050 or communicate with the processor 2050 through a separate interface. In a case in which the memory 2040 communicates with the processor 2050 through a separate interface, the processor 2050 may store or retrieve data, through various interface standards such as the SD, SDHC, SDXC, MICRO SD, USB standards or the like.

The processor 2050 may control operations of respective components included in the electronic apparatus 2000. The processor 2050 may perform control and processing in association with voice communications, video telephony, data communications and the like, or may perform control and processing for multimedia reproduction and management. In addition, the processor 2050 may process information input by a user through the input unit 2020 and may output results thereof through the output unit 2030. In addition, the processor 2050 may store data required to control the operation of the electronic apparatus 2000 as described above, in the memory 2040, or fetch data from the memory 2040.

Figure 21:
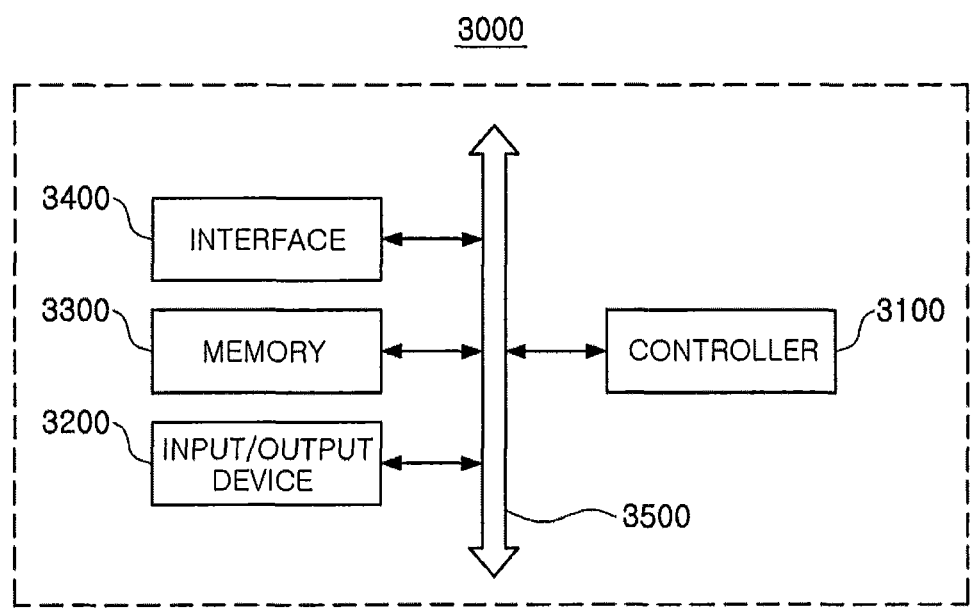
FIG. 21 is a block diagram illustrating a system including a semiconductor device according to an example embodiment of the inventive concepts.

FIG. 21 is a block diagram of a system 3000 including a semiconductor device according to an example embodiment of the inventive concepts.

Referring to FIG. 21, the system 3000 may include a controller 3100, an input/output device 3200, a memory 3300, and an interface 3400. The system 3000 may be a mobile system. Examples of the mobile system may include PDAs, portable computers, web tablets, wireless phones, mobile phones, digital music players and memory cards.

The controller 3100 may execute a program and control the system 3000. The controller 3100 may be a microprocessor, a digital signal processor, a microcontroller or device similar thereto.

The input/output device 3200 may be used to input or output data to or from the system 3000. The system 3000 may be connected to an external device, for example, a personal computer or networks and may exchange data with the external device. The input/output device 3200 may be a keypad, a keyboard, or a display device.

The memory 3300 may store a code and/or data for operating the controller 3100 and/or store data that was processed by the controller 3100. The memory 3300 may include semiconductor devices according to one of the example embodiments of the inventive concepts.

The interface 3400 may be a data transmission path between the system 3000 and an external device. The controller 3100, the input/output device 3200, the memory 3300, and the interface 3400 may be in communication with one another via a bus 3500.

At least one of the controller 3100 or the memory 3300 may include at least one of the semiconductor devices described above with reference to FIGS. 1 through 15.

The above-disclosed subject matter is to be considered illustrative and not restrictive, and the appended claims are intended to cover all such modifications, enhancements, and other embodiments, which fall within the true spirit and scope of the inventive concepts. Thus, the scope of the inventive concepts is to be determined by the broadest permissible interpretation of the following claims and their equivalents, and shall not be restricted or limited by the foregoing detailed description.

The invention claimed is:

1. A semiconductor device, comprising:
a substrate having a first region and a second region;
a plurality of first gate structures in the first region, the first gate structures being spaced apart from each other by a first distance;
a plurality of second gate structures in the second region, the second gate structures being spaced apart from each other by a second distance;
a plurality of first spacers on sidewalls of the respective first gate structures;
a dielectric layer on outer sidewalls of the respective first spacers;
a plurality of second spacers on sidewalls of the respective second gate structures; and
a plurality of third spacers on outer sidewalls of the respective second spacers,
wherein a sum of a first thickness of a first of the first spacers and a second thickness of the dielectric layer that are on a sidewall of a first of the first gate structures is substantially equal to a sum of a third thickness of a first of the second spacers and a fourth thickness of a first of the third spacers that are on a sidewall of a first of the second gate structures.

2. The semiconductor device of claim 1, wherein the first thickness of the first of the first spacers is substantially equal to the third thickness of the first of the second spacers; and
wherein the second thickness of the dielectric layer is substantially equal to the fourth thickness of the first of the third spacers.

3. The semiconductor device of claim 1, wherein the first distance is substantially equal to the second distance; and
wherein a first gap that is between portions of the dielectric layer that are on facing sidewalls of an adjacent pair of the first gate structures is substantially equal to a second gap between the third spacers that are on facing sidewalls of an adjacent pair of the second gate structures.

4. The semiconductor device of claim 3, further comprising an etch stop layer on sidewalls of the dielectric layer and the third spacers,
wherein a third gap between portions of the etch stop layer that axe on facing sidewalls of the adjacent pair of the first gate structures is substantially equal to a fourth gap between portions of the etch stop layer that are on facing sidewalls of the adjacent pair of the second gate structures.

5. The semiconductor device of claim 1, further comprising at least a first active fin that extends in a first direction in the first region to cross under the first gate structures;
wherein the first spacers have an L-shaped cross-section.

6. The semiconductor device of claim 5, wherein the first of the first spacers has a parallel portion and a perpendicular portion with respect to an upper surface of the substrate, a length of the parallel portion in the first direction being substantially equal to or greater than the sum of the first thickness and the second thickness.

7. The semiconductor device of claim 1, further comprising a plurality of first embedded source/drain regions on opposed sides of the first gate structures,
wherein the dielectric layer covers upper surfaces of the first embedded source/drain regions.

8. The semiconductor device of claim 5, further comprising at least a second active fin that extends in the first direction in the second region to cross under the second gate structures;
wherein the second spacers have an L-shaped cross-section.

9. The semiconductor device of claim 8, wherein the first of the second spacers has a parallel portion and a perpendicular portion with respect to an upper surface of the substrate, a length of the parallel portion in the first direction being greater than the sum of the third thickness and the fourth thickness.

10. The semiconductor device of claim 8, wherein the third spacers have an L-shaped cross-section.

11. The semiconductor device of claim 1, further comprising a plurality of second embedded source/drain regions on opposed sides of the second gate structures,
wherein the second embedded source/drain regions comprise silicon germanium (SiGe) doped with a P-type impurity.

12. The semiconductor device of claim 11, wherein the second embedded source/drain regions include a plurality of regions having different germanium (Ge) concentration from each other.

13. A semiconductor device, comprising:
a substrate having a first region and a second region, the first region including a plurality of first active fins and the second region including a plurality of second active fins;
a plurality of first gate structures that cross over the first active fins in the first region, the first gate structures being spaced apart from each other by a first distance;
a plurality of first embedded source/drain regions on opposed sides of the first gate structures;
a plurality of first spacers that have L-shaped cross-sections on sidewalls of the respective first gate structures;
a dielectric layer on outer sidewalls of the first spacers and on upper surfaces of the first embedded source/drain regions;
a plurality of second gate structures that cross over the second active fins in the second region, the second gate structures being spaced apart from each other by a second distance;
a plurality of second embedded source/drain regions on opposed sides of the second gate structures;
a plurality of second spacers that have L-shaped cross-sections on sidewalls of the respective second gate structures; and a plurality of third spacers that have L-shaped cross-sections on outer sidewalls of the second spacers.

14. The semiconductor device of claim 13, wherein a sum of a first thickness of a first of the first spacers that is on a first of the first gate structures and a second thickness of the dielectric layer that is on a sidewall of the first of the first gate structures is substantially equal to a sum of a third thickness of a first of the second spacers that is on a first of the second gate structures and a fourth thickness of a first of the third spacers that is on a sidewall of the first of the second spacers.

15. A semiconductor device, comprising:
a substrate having an upper surface that extends in a first direction and in a second direction that is perpendicular to the first direction;
a first active fin extending in the first direction in a first region of the substrate;
a first gate structure that crosses over the first active fin in the first region of the substrate;
a first embedded source/drain region on a first side of the first gate structure;
a pair of first spacers having respective inner sidewalk that are directly on respective opposed sidewalls of the first gate structure, each of the first spacers including a first portion that extends in the first direction and a second portion that extends in a third direction that is perpendicular to both the first direction and the second direction;
a dielectric layer that comprises a material different from a material of the first spacers directly on outer sidewalls of the respective first spacers;
a second active fin extending in the first direction in a second region of the substrate;
a second gate structure that crosses over the second active fin in the second region of the substrate;
a second embedded source/drain region on a first side of the second gate structure;
a pair of second spacers having respective inner sidewalls that are directly on respective opposed sidewalls of the second gate structure, each of the second spacers including a first portion that extends in the first direction and a second portion that extends in the third direction;
a pair of third spacers that comprises a material different from a material of the second spacers directly on outer sidewalls of the respective second spacers; and
an etch stop layer,
wherein the dielectric layer extends across an upper surface of the first embedded source/drain region while the third spacer does not extend across an upper surface of the second embedded source/drain region, and
wherein the etch stop layer directly contacts an upper surface of the second embedded source/drain region and directly contacts a portion of the dielectric layer that is on an upper surface of the first embedded source/drain region.

16. The semiconductor device of claim 15, wherein each of the first spacers has a first thickness, the dielectric layer has a second thickness, each of the second spacers has a third thickness and each of the third spacers has a fourth thickness, and wherein a sum of the first thickness and the second thickness is substantially equal to a sum of the third thickness and the fourth thickness.

17. The semiconductor device of claim 16, wherein the first thickness is substantially equal to the third thickness and the second thickness is substantially equal to the fourth thickness.

18. The semiconductor device of claim 15, wherein the first embedded source/drain region has an upper surface that is above the upper surface of the substrate, and the second embedded source/drain region is coplanar with the upper surface of the substrate.

19. The semiconductor device of claim 15, wherein the third spacers each have a first portion that extends in the first direction and a second portion that extends in the third direction.

20. The semiconductor device of claim 14, wherein the first distance is substantially equal to the second distance; and
wherein a first gap that is between portions of the dielectric layer that are on facing sidewalls of an adjacent pair of the first gate structures is substantially equal to a second gap between the third spacers that are on facing sidewalls of an adjacent pair of the second gate structures.

* * * * *